(12) United States Patent
Mizukoshi

(10) Patent No.: US 7,423,314 B2
(45) Date of Patent: Sep. 9, 2008

(54) SEMICONDUCTOR MEMORY DEVICE AND METHOD FOR THE SAME

(75) Inventor: Toshikazu Mizukoshi, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/848,944

(22) Filed: Aug. 31, 2007

(65) Prior Publication Data

US 2008/0099831 A1    May 1, 2008

(30) Foreign Application Priority Data

Oct. 31, 2006   (JP)   ............... 2006-296364

(51) Int. Cl.
   *H01L 23/62*   (2006.01)
(52) U.S. Cl. .............. 257/321; 257/314; 257/315; 257/E29.129
(58) Field of Classification Search ............ 257/314, 257/315, 321; 438/593, 257, 211
See application file for complete search history.

(56) References Cited

U.S. PATENT DOCUMENTS 7,211,878 B2    5/2007   Ono et al.

2005/0157529 A1    7/2005   Iwata et al.
2006/0244070 A1    11/2006   Iwata et al.

FOREIGN PATENT DOCUMENTS

| JP | 2004-056089 | 2/2004 |
| JP | 2004-221546 | 8/2004 |
| JP | 2005-064295 | 3/2005 |

*Primary Examiner*—Evan Pert
*Assistant Examiner*—Tan N Tran
(74) *Attorney, Agent, or Firm*—Rabin & Berdo, P.C.

(57) ABSTRACT

A semiconductor substrate 20, a gate electrode 34, first and second impurity diffusion regions 24a and 24b, first and second variable-resistance regions 22a, 22b, first and second main electrodes 36a, 36b, first and second charge storing units 40a, 40b are included therein.

The first and second charge storing units are configured by stacking layers in order from bottom oxide films 41a, 41b to charge storing nitride films 42a, 42b to top oxide films 43a, 43b, respectively. At the same time, the distance between the first main electrode and the charge storing nitride film formed in the first charge storing unit is constant, and the distance between the second main electrode and the charge storing nitride film formed in the second charge storing unit is constant.

4 Claims, 18 Drawing Sheets

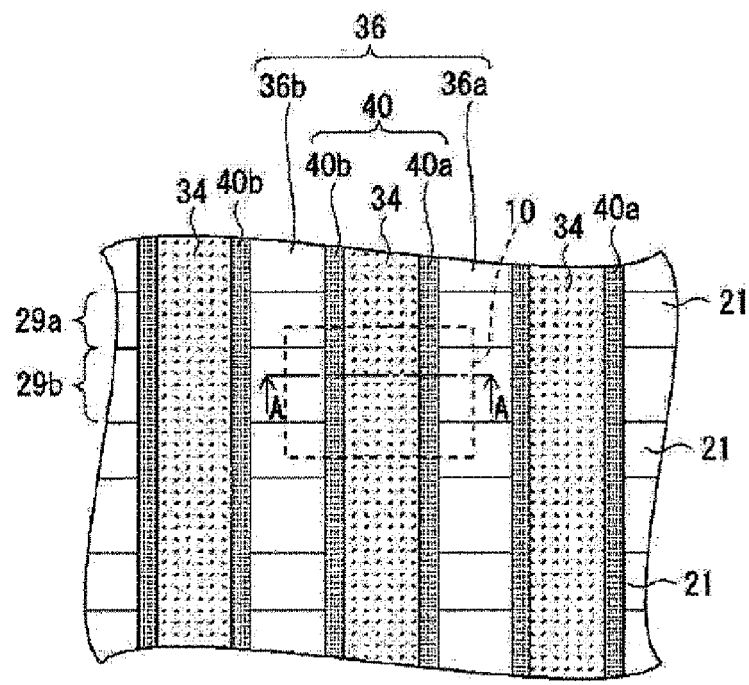
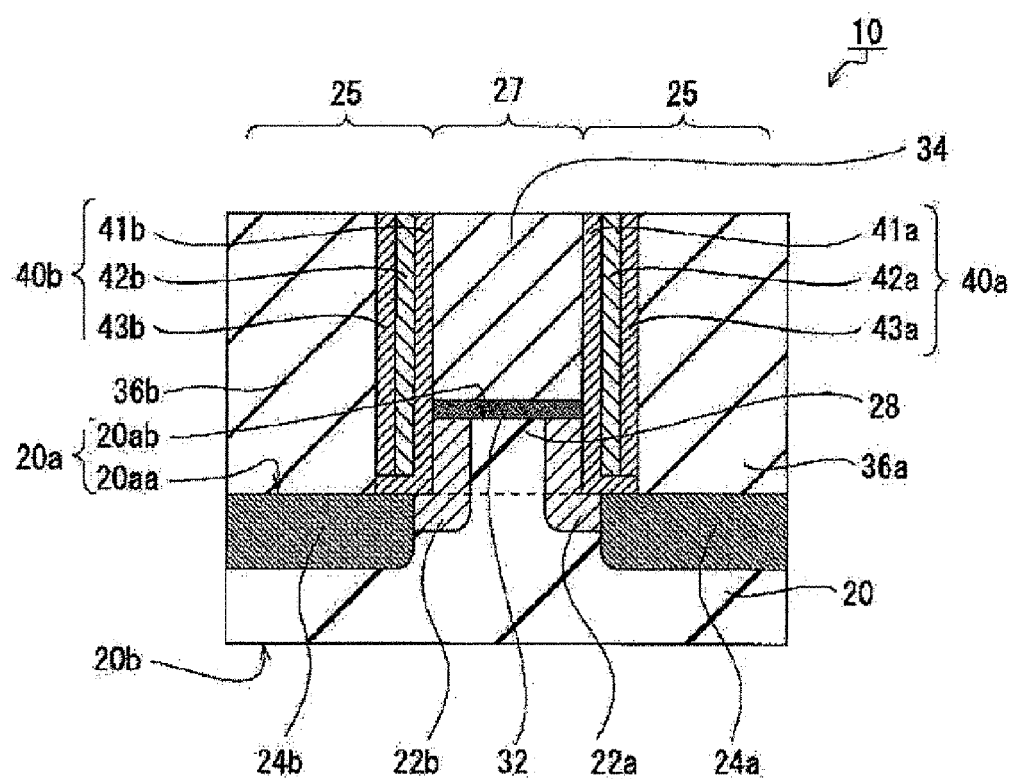
Fig. 1: Non-volatile semiconductor memory

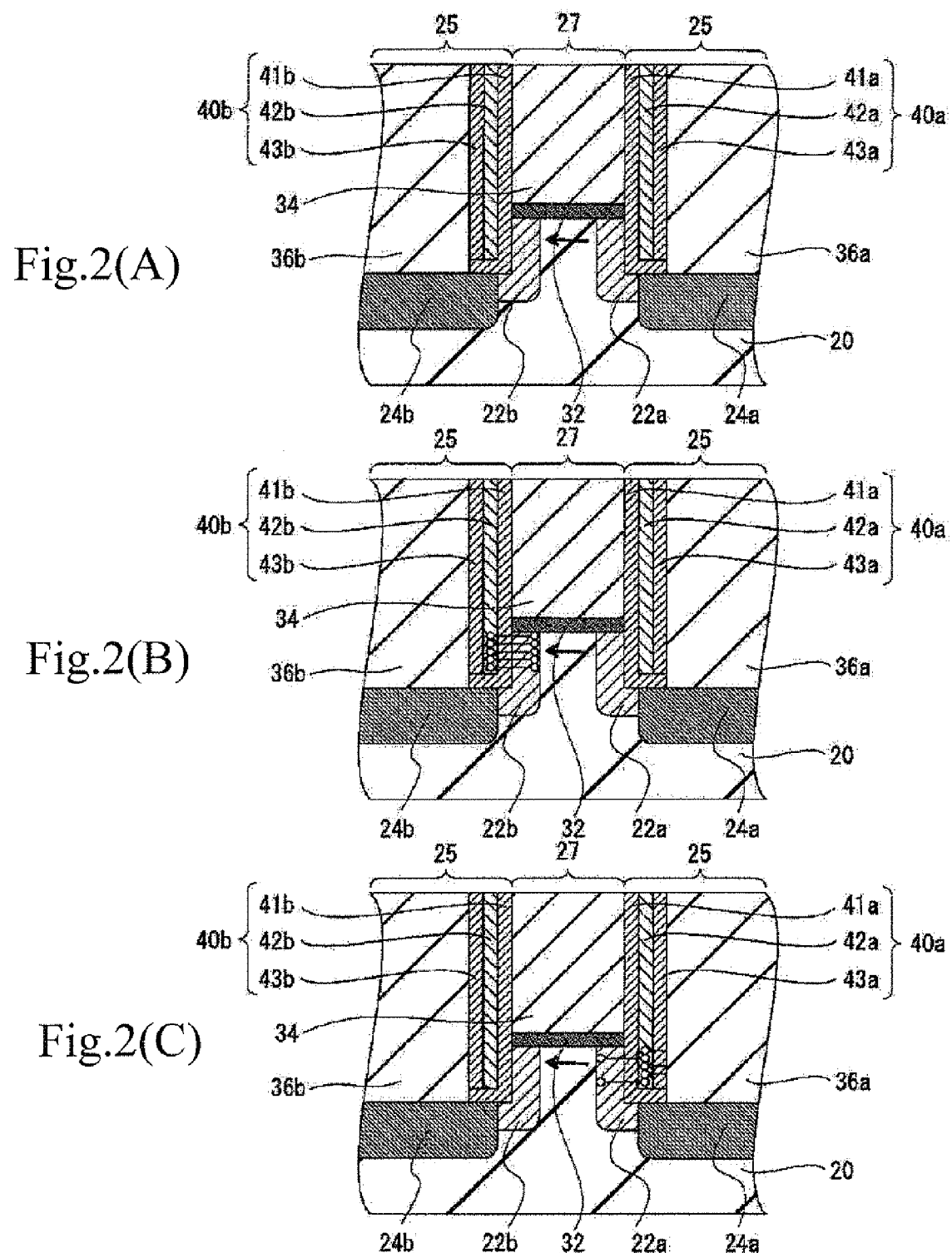
Fig. 2: Method for judging whether or not stored charge is present

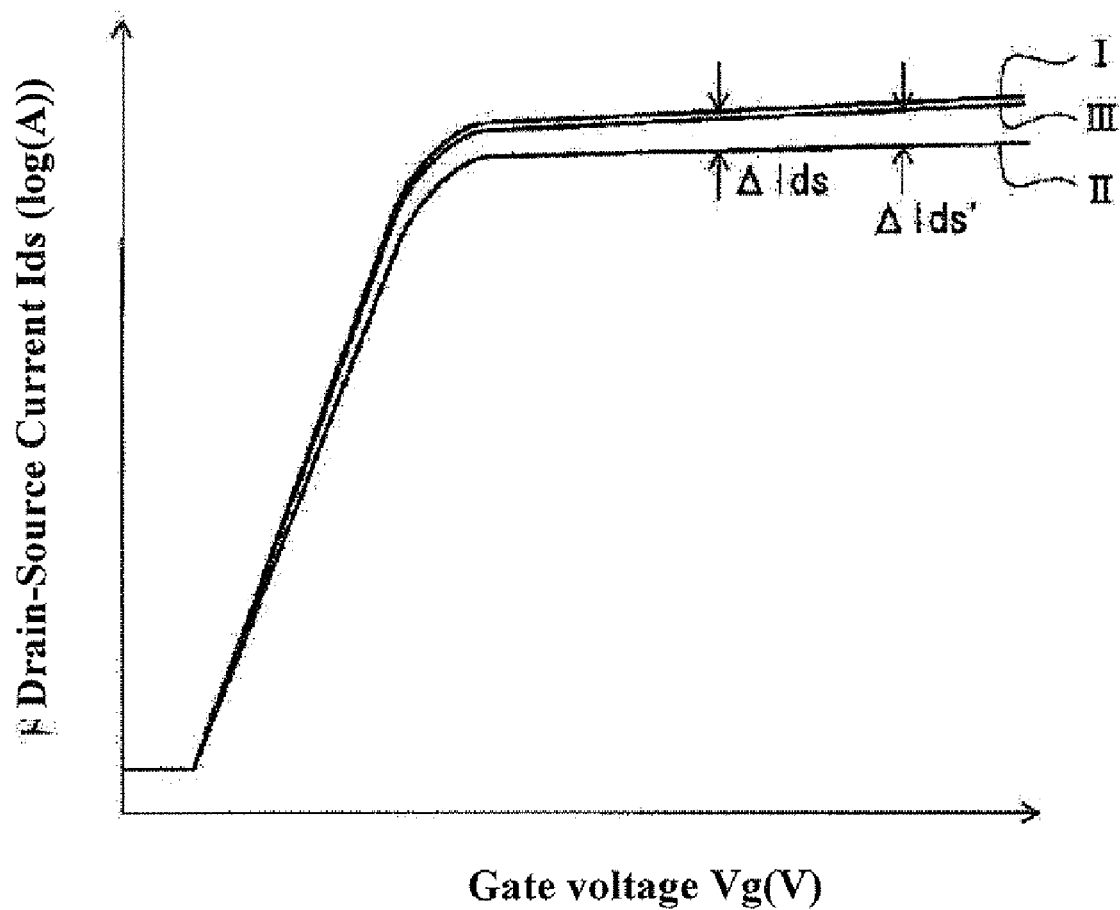
Fig. 3: Sub-threshold characteristics

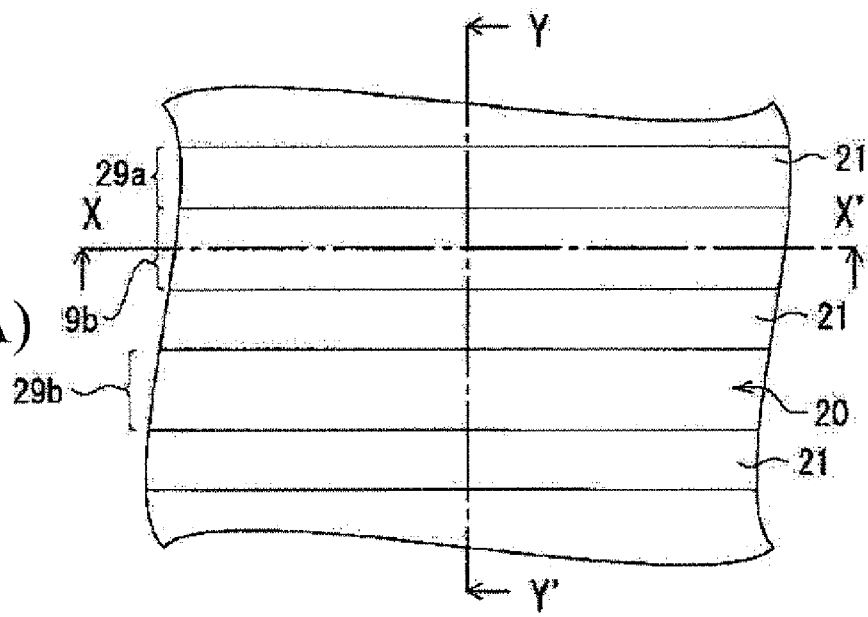
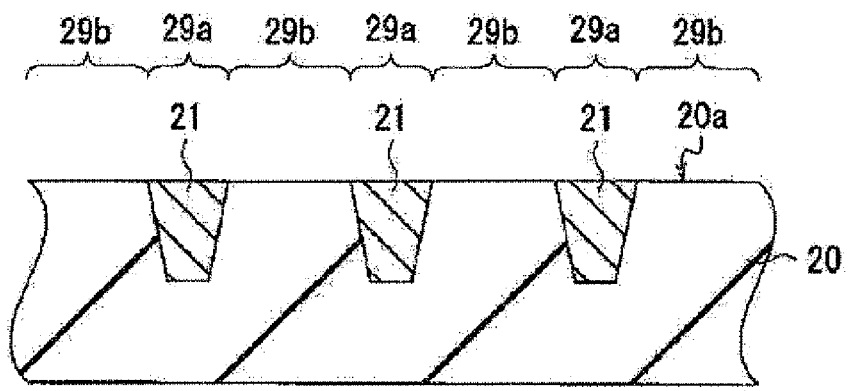
Fig. 4: Process diagram (part 1) of a manufacturing method for a non-volatile semiconductor memory

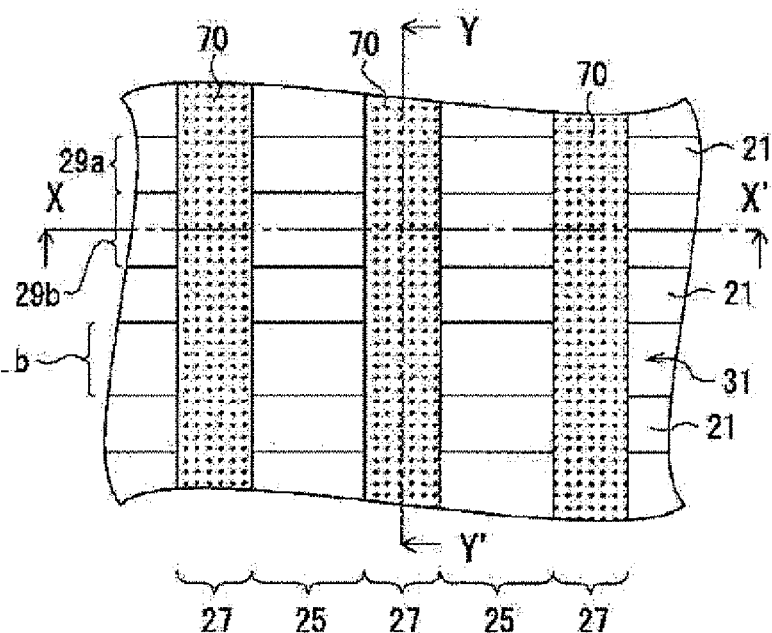
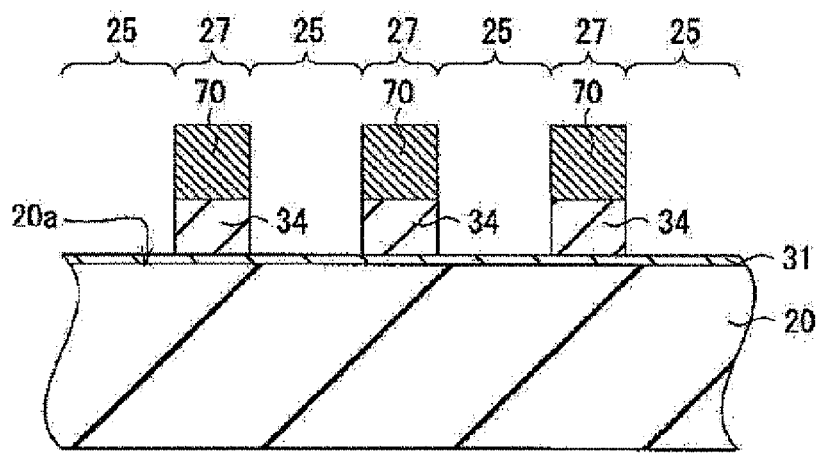
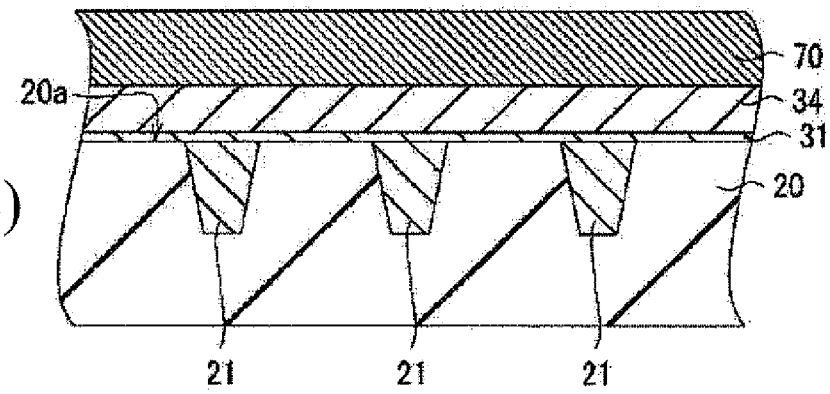
Fig. 5: Process diagram (part 2) of a manufacturing method for a non-volatile semiconductor memory 45: First silicon oxide film Fig. 6: Process diagram (part 3) of a manufacturing method for a non-volatile semiconductor memory 23: Impurity diffusion region Fig. 7: Process diagram (part 4) of a manufacturing method for a non-volatile semiconductor memory Fig. 8: Process diagram (part 5) of a manufacturing method for a non-volatile semiconductor memory

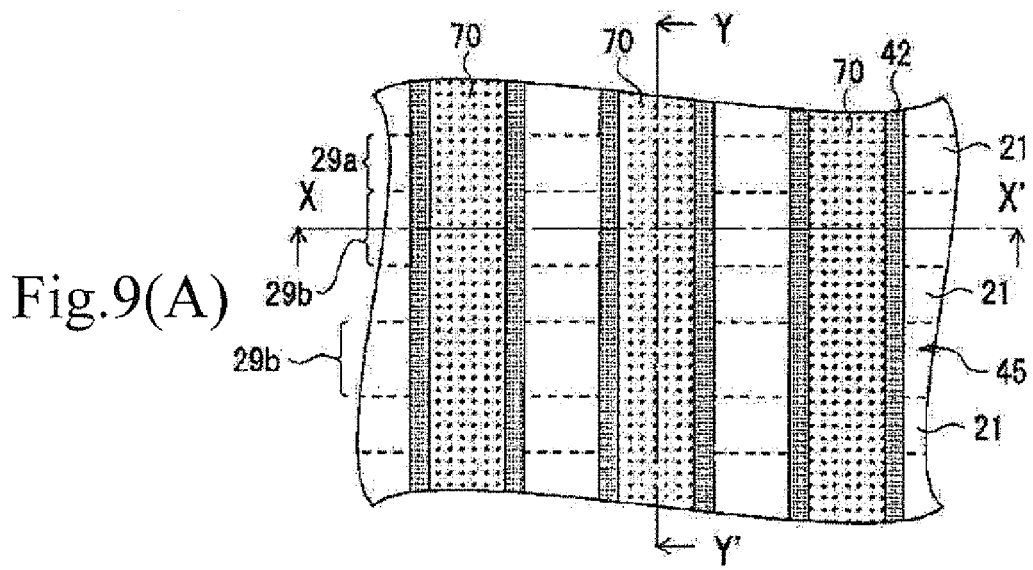
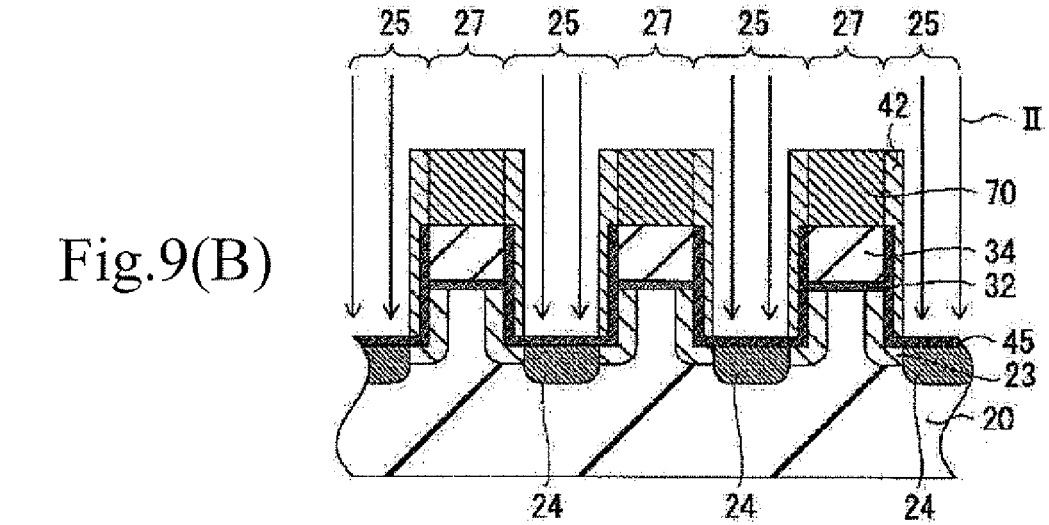
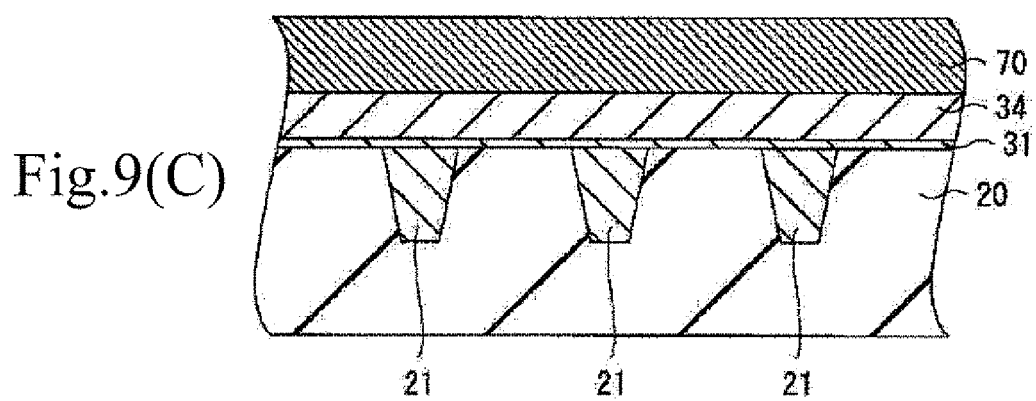
Fig. 9: Process diagram (part 6) of a manufacturing method for a non-volatile semiconductor memory 80: Second silicon oxide film Fig. 10: Process diagram (part 7) of a manufacturing method for a non-volatile semiconductor memory 82: Oxide film mask スク

Fig. 11: Process diagram (part 8) of a manufacturing method for a non-volatile semiconductor memory Fig. 12: Process diagram (part 9) of a manufacturing method for a non-volatile semiconductor memory 36: Conductive film Fig. 13: Process diagram (part 10) of a manufacturing method for a non-volatile semiconductor memory Fig. 14: Process diagram (part 11) of a manufacturing method for a non-volatile semiconductor memory Fig. 15: Process diagram (part 12) of a manufacturing method for a non-volatile semiconductor memory

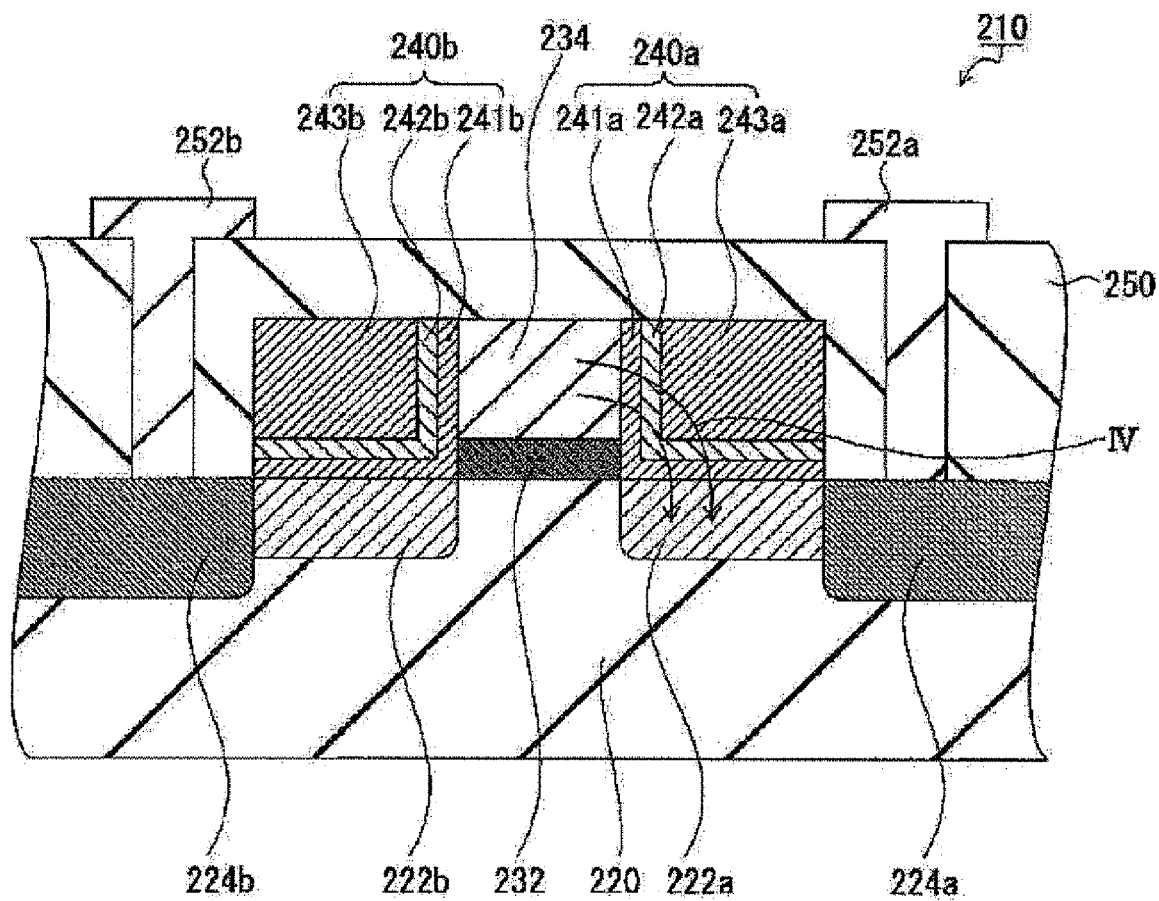
Fig. 16: Conventional non-volatile semiconductor memory

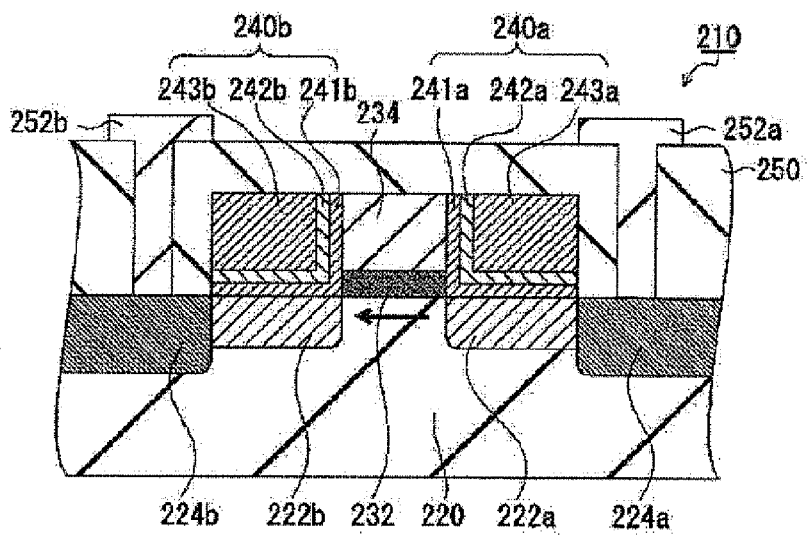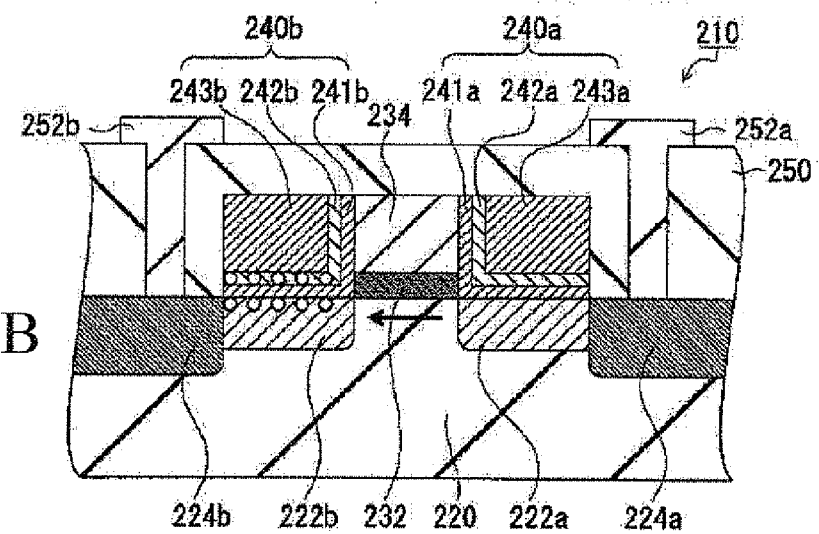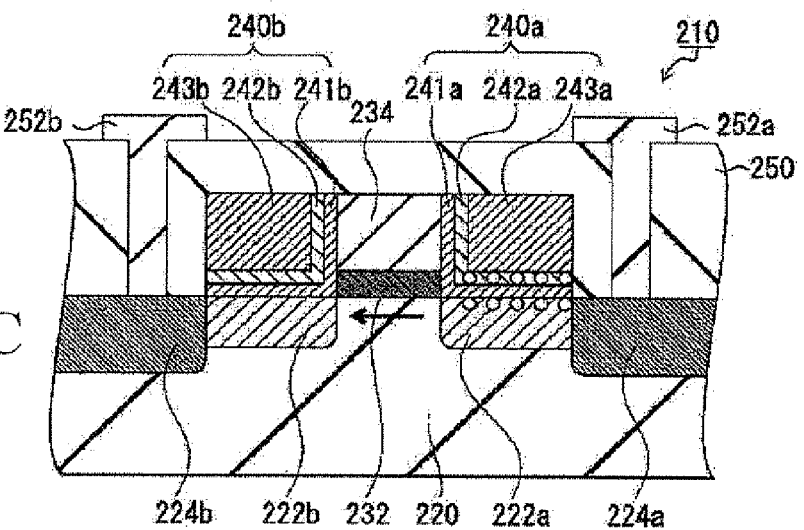
Fig. 17: Conventional method for judging whether or not stored charge is present.

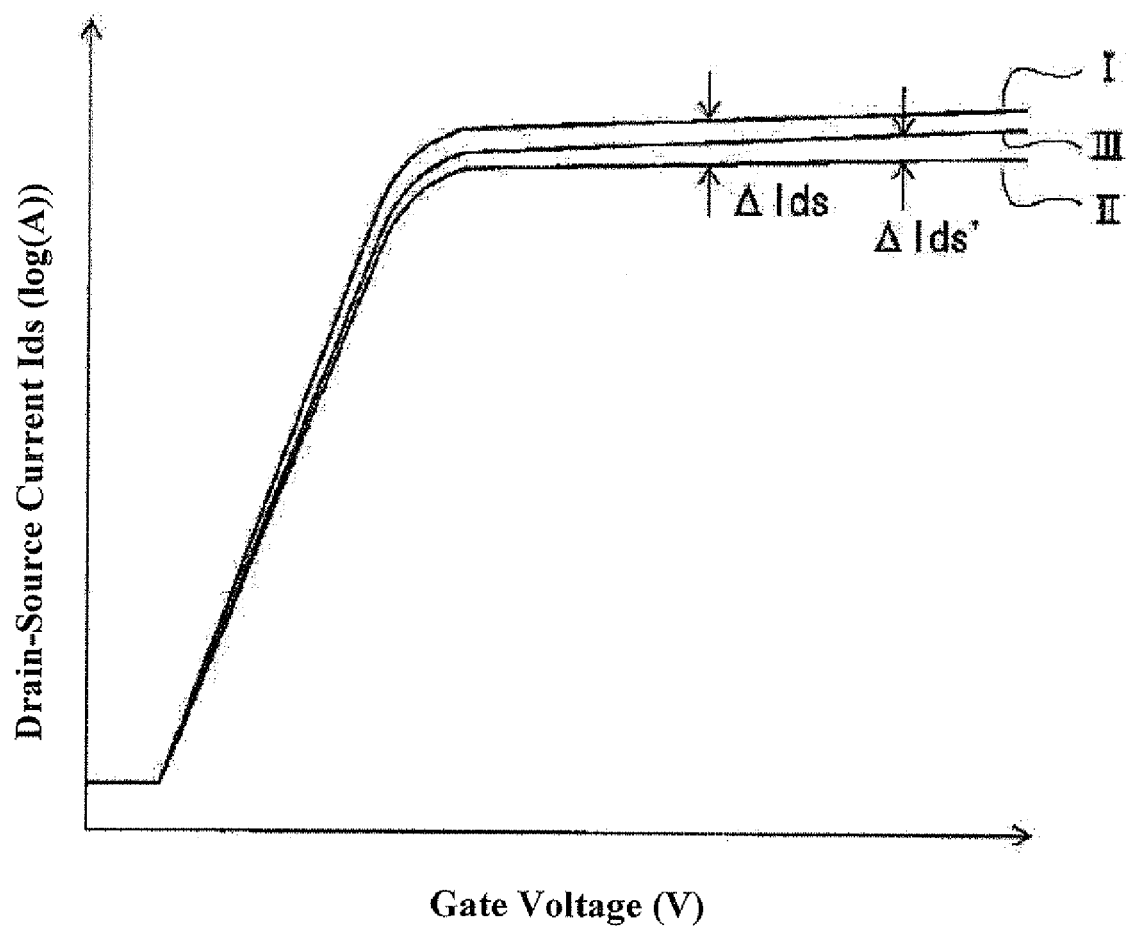
Fig. 18: Conventional sub-threshold characteristics

SEMICONDUCTOR MEMORY DEVICE AND METHOD FOR THE SAME

BACKGROUND OF THE INVENTION

Field of the Invention

The preset invention relates to a semiconductor memory device and method for the same. There is a non-volatile semiconductor memory heretofore proposed (refer to, for example, patent document 1, 2, or 3) as a semiconductor memory device.

The above conventional non-volatile semiconductor memory will be explained as below, referring to FIG. 16. FIG. 16 is a view of explanatory diagram of the conventional non-volatile semiconductor memory and a general cross section thereof.

The basic cell of the non-volatile semiconductor memory (hereinafter referred to as "memory cell") 210 has MOS-type transistors (MOSFET) fabricated on the silicon substrate 220. The MOSFET includes the gate electrode 234, the first and second impurity diffused regions 224a, 224b, the first and second variable-resistance regions 222a, 222b, and the first and second main electrodes 252a, 252b.

The gate electrode 234 is formed through the intermediary of the gate oxide 232 on the silicon substrate 220.

The first and second impurity diffusion regions 224a, 224b are formed in the place clipping the gate electrode 234 by diffusion of, for example, n-type impurity. The above first and second impurity diffusion regions 224a, 224b are regions having function of MOSFET source or drain.

The following explanation will be explain a case where the first impurity diffused region 224a is used as the drain thereof and the second diffused region 224b is used as the source thereof. In the explanation thereof, the drain and the source are given the same numerals between the first and second impurity diffusion regions 224a, 224b, respectively.

The first and second variable resistance regions 222a, 222b are regions formed between first and second impurity diffusion regions 224a, 224b and the region underneath the gate electrode 234, respectively. The first and second variable resistance regions 222a, 222b are the same conductive-type regions, that is, n-type impurity diffused regions as the first and second impurity diffusion regions 224a, 224b. The densities of the first and second variable resistance regions 222a, 222b are lower than ones of the first and second impurity diffusion regions 224a, 224b.

The first and second main electrodes 252a, 252b are formed on the first and second impurity diffused regions 224a, 224b of the silicon substrate 220, respectively.

The above non-volatile semiconductor memory includes the first charge storage unit 240a on the first variable-resistance unit 222a, and the second charge storage unit 240b on the second variable-resistance unit 222b. The first and second charge units 240a, 240b are charge-storing multi-layer structures (hereinafter referred to as "ONO multi-layer insulting film") having the sequentially-stacked bottom oxide films 241a, 241b, charge-storage nitride films 242a, 242b, and top oxide films 243a, 243b.

The memory cell 210 varies resistances of the first and second variable-resistance units 222a, 222b formed in the region underneath the first and second charge storage units 240a, 240b of the surface-layer region of silicon substrate 220, by presence or absence of the electron stored in the first and second charge storing units 240a, 240b, respectively, and then the memory cell 220 determines "1" or "0" of data.

Electron is injected into the first charge storing unit 240a by grounding the source 224b and the substrate 220 and applying plus voltage to the gate electrode 234 and the drain 224a. At the above instance, the electron running through a channel formed between the drain and the source becomes a high-energy state, that is, a hot electron by the strong electric field nearby the drain. The above hot electron is injected into the first charge storing unit 240a by the electric filed between the gate electrode 234 and the first variable-resistance unit 222a (indicated by the arrowhead in the diagram).

The state of storing the electron injected into the first charge storing unit 240a in the first charge storing unit 240a is defined as "1", and the state of not storing the above electron is defined as "0" so that the data can be discriminated.

The method for judging whether or not the stored charge is present in the conventional example will be explained, referring to FIG. 17 and FIG. 18. FIG. 17 is a view of modeling diagram explaining the method for judging whether or not the stored charge is present in the conventional example. FIG. 18 is a diagram showing the conventional sub-threshold characteristics. In FIG. 18, the horizontal axis indicates the gate voltage Vg (V), and the vertical axis indicates the drain-source current Ids (log(A)).

FIG. 17(A) shows the state of not stored charge, that is, not written data. FIG. 17(B) shows the state of stored charge in the second charge storing unit 240b.

For example, in the case where charge is stored in the second chare storing unit 240b, the resistance value underneath the second charge storing unit 240b rises. In the case where the second charge storing unit 240b is the object to be read, the second impurity diffusion region (source) 224b neighboring the second charge storing unit 240b is provided with ground voltage, and the first impurity diffusion region (drain) 224a located in the opposite side through the intermediary of the gate electrode 234 is provided with plus voltage. At the above instance, the charge stored in the second charge storing unit 240b induces plus charge in the second variable-resistance unit 222b underneath the second charge storing unit 240b. The resistance value of the second variable-resistance unit 222b underneath the second charge storing unit 240b rises by the above induced charge and the drain-source current Ids decreases (shown in "II" of FIG. 18).

Meanwhile, in the case where the electron is not stored in the second charge storing unit 240b, the resistance value of the second variable-resistance unit 222b does not rise, and then the drain-source current Ids does not decrease (shown in "I" of FIG. 18). The data of "0" and "1" can be distinguished by the above drain-source current differential.

The above method for judging whether or not the charge is present is based on the fact that horizontal electric field of MOSFET nearby drain is stronger than nearby drain and the drain-source current is dominated by resistance on the source side.

Moreover, when the voltage values applied to the drain 224a and the source 224b are alternated, it can be judged whether the electron is stored in the second charge storing unit 240b, or not. Therefore, two-bit data can be stored in one memory cell.

Patent document 1: Japanese patent laid-open number 2004-56089.
Patent document 2: Japanese patent laid-open number 2004-221546.
Patent document 3: Japanese patent laid-open number 2005-64295.

Meanwhile, in the case where the electron is charged in the first charge storing unit located in the opposite side through the intermediary of the gate electrode the second charge storing unit having data to be read out in the before-mentioned non-volatile semiconductor memory, the problem arises, as explained below. The above problem is described in details as follows. In the case where the electron is stored in the first charge storing unit, plus charge is induced in the first variable-resistance unit underneath the first charge storing unit, as in the aforementioned case of the second charge storing unit. The resistance value of the first variable-resistance unit underneath the first charge storing unit is varied by the above induced plus charge. Therefore, in the case where the resistance value is varied, the drain-source current is ideally not influenced due to depletion layer generated near the drain, however, there is some possibility that the drain-source current Ids decreases practically.

FIG. 17(C) shows the state where charge is stored in the first charge storing unit 240a and no charge is stored in the second charge storing unit 240b. In the above case, since the resistance value of the second variable-resistance unit 222b does not increase when there is no influence from the charge stored in the charge storing unit 240a, the drain-source current Ids does not decrease (indicated by "I" in FIG. 18). However, there is influence from the charge stored in the first charge storing unit 240a, the drain-source current Ids decreases (indicated by "III" in FIG. 18). Consequently, the drain-source current differential Ids between the state (II) where no charge is stored in the first charge storing unit 240a and charge is stored in the second charge storing unit 240b; and the state III where charge is stored in the first charge storing unit 240a and no charge is stored in the second charge storing unit 240b; becomes smaller. Therefore, it becomes impossible to read out data accurately.

SUMMARY OF THE INVENTION

The present invention has been invented in consideration of the above-mentioned problem, and the object of the resent invention is providing a semiconductor memory apparatus and production method thereof having capability to keep the drain-source current differential Ids between each of the states of presence and absence of the electron stored in the charge storing unit being read out large by restraining decrease of the drain-source current Ids caused by the electron stored in the charge storing unit being not read out.

To achieve the aforementioned object, the semiconductor memory device of the present invention includes a semiconductor substrate, gate electrodes, first and second impurity diffusion regions, a first and second variable-resistance units, first and second main electrodes, and first and second charge-storing units.

In the semiconductor substrate, a flat region, and a step region having one main surface higher than the other main surface being placed higher than the flat region are included. The gate electrode is formed through the intermediary of the gate oxide film on one of the main surface of the strip region of the semiconductor surface.

The first and second impurity diffusion regions are a couple of impurity diffusion region formed in the place clipping the gate electrode of a part of the flat region in the surface region on one of main surface sides of the semiconductor substrate.

The first and second variable-resistance regions are formed between the region underneath the gate electrode and the first and second impurity regions in the surface region of the semiconductor substrate, respectively. The first and second variable-resistance regions are formed from the region located next to the first and second impurity regions to the side face of the step unit formed in the step region. The first and second variable-resistance regions are the regions where the second conductive-type impurity is diffused, and the densities of the impurity are lower than in the first and second impurity diffusion regions.

The first and second main electrodes are formed in the first and second impurity regions of the semiconductor substrate. The first charge storing unit is formed between and facing the first main electrode and the gate electrode.

The first and second charge-storing units are formed by stacking in order from a bottom oxide film, to a charge-storing nitride film, to a top oxide film, respectively. Moreover, the distance between the first electrode and the charge-storing nitride film formed in the first charge storing unit is constant, and the distance between the second electrode and the charge-storing nitride film formed in the second charge storing unit is constant.

The semiconductor memory device according to the present invention includes the charge-storing unit in the place clipped by the step unit and the main electrode of the silicon substrate so that the above charge-storing unit neighbors the above main electrode and the step unit, respectively. Moreover, the distance between and facing main electrode and the charge-storing nitride film formed in the charge-storing unit is constant.

In the above case, since the electric field between the plus voltage applied to the main electrode and the step unit heads to the opposite direction to the electric field generated by the electron stored in the charge-storing unit, it is contemplated that the above electric field cancels the electric field generated by the electron. Consequently, when plus voltage is provided the main electrode, plus charge induced by the electron stored in the charge storing unit neighboring the main electrode provided with plus voltage can be reduced.

Therefore, the electron stored in the charge-storing nitride film formed in the charge-storing unit not being read out; can restrain the electric filed induced to the variable-resistance unit, and then resistance rising in the variable-resistance unit can be prevented.

BRIEF DESCRIPTION OF THE DRAWINGS

FIG. 1: A view of general diagram of non-volatile semiconductor memory.

FIG. 2: A view of general explanatory diagram of a method for judging whether or not stored charge is present.

FIG. 3: A view of diagram showing the sub-threshold characteristics.

FIG. 4: A view of process diagram (part 1) of a manufacturing method for a non-volatile semiconductor memory.

FIG. 5: A view of process diagram (part 2) of a manufacturing method for a non-volatile semiconductor memory.

FIG. 9: A view of process diagram (part 6) of a manufacturing method for a non-volatile semiconductor memory.

FIG. 16: A view of general diagram of a conventional non-volatile semiconductor memory.

FIG. 17: A view of general explanatory diagram of a conventional method for judging whether or not stored charge is present.

FIG. 18: A view of diagram showing the conventional sub-threshold characteristics.

DETAILED DESCRIPTION OF THE PREFERRED EMBODIMENT

Figure 6A:
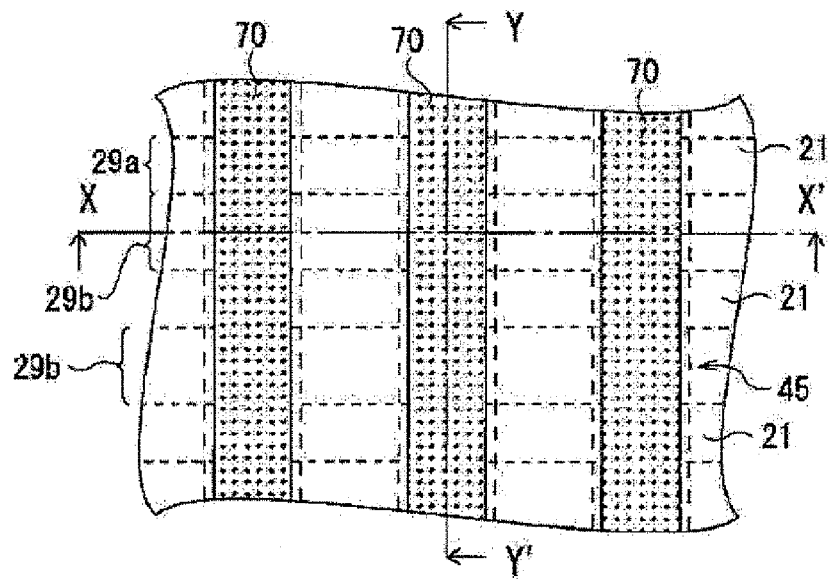
FIG. 6: A view of process diagram (part 3) of a manufacturing method for a non-volatile semiconductor memory.
Figure 6B:
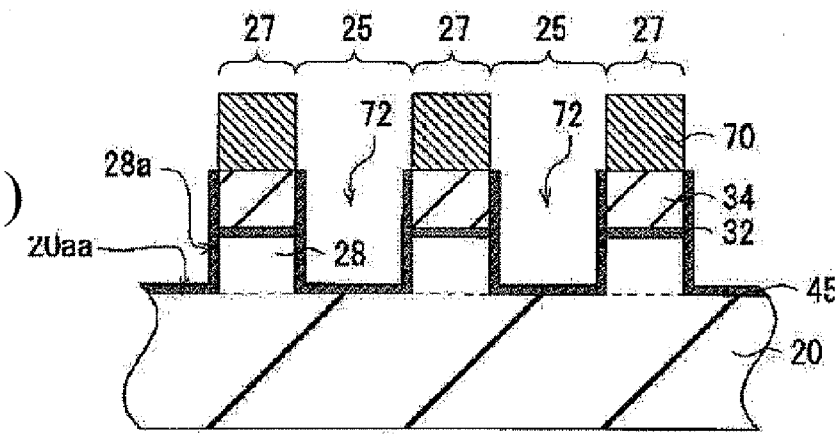
Figure 6C:
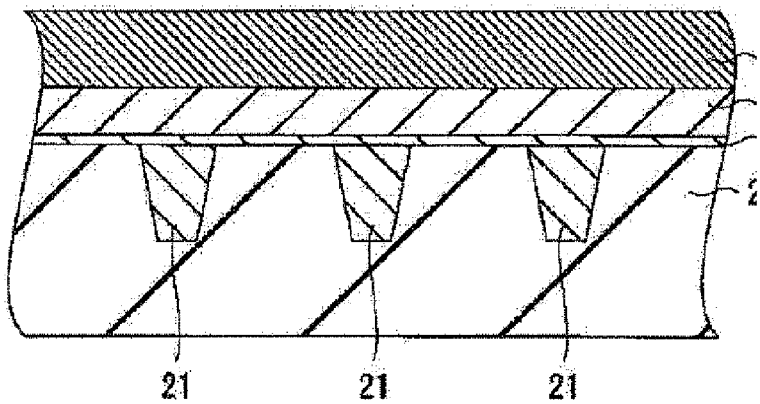
Figure 7A:
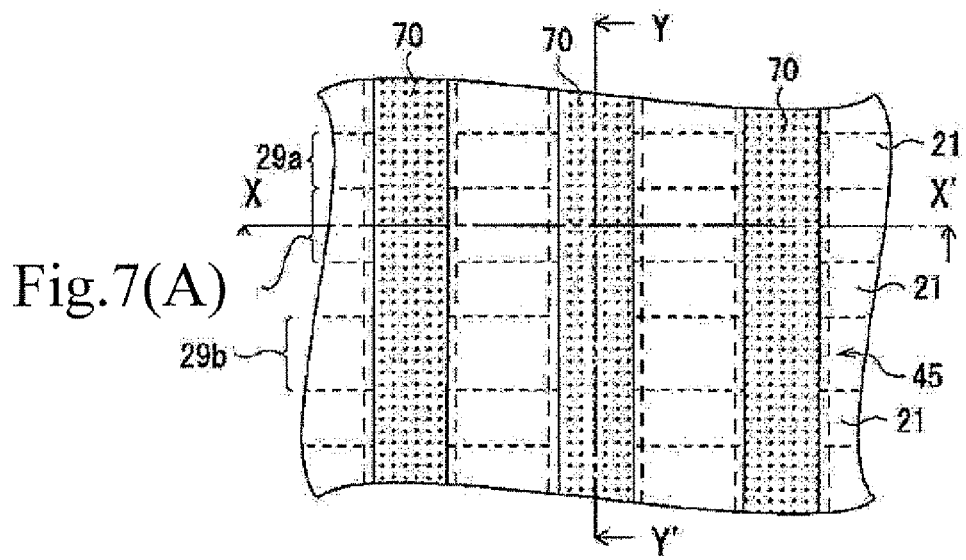
FIG. 7: A view of process diagram (part 4) of a manufacturing method for a non-volatile semiconductor memory.
Figure 7B:
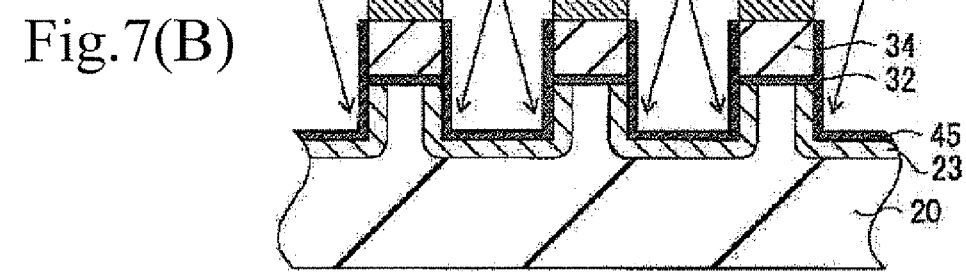
Figure 7C:
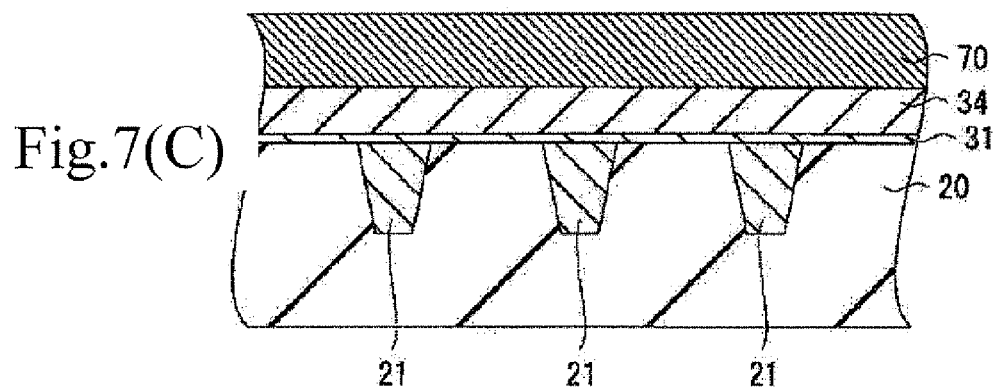
Figure 8A:
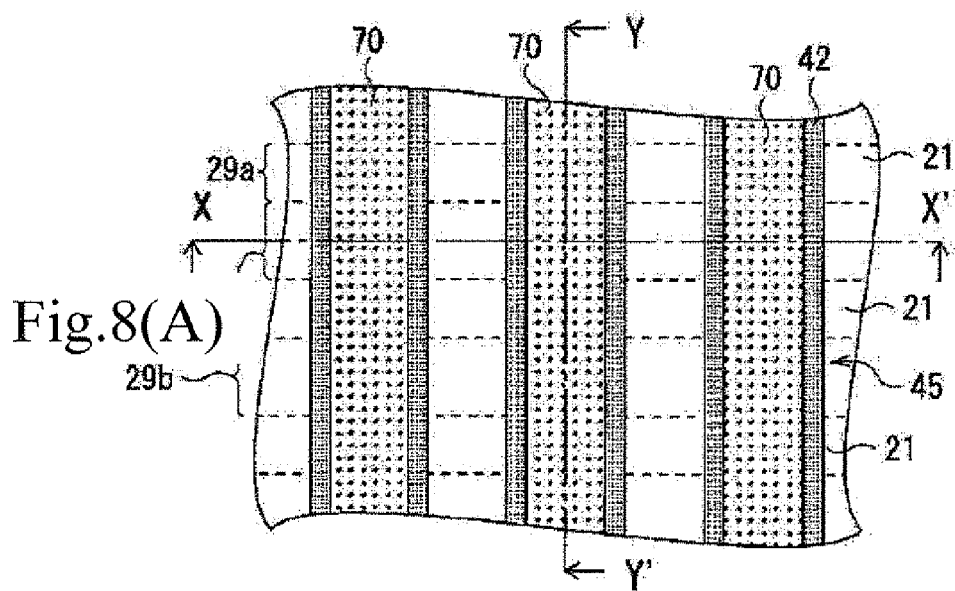
FIG. 8: A view of process diagram (part 5) of a manufacturing method for a non-volatile semiconductor memory.
Figure 8B:
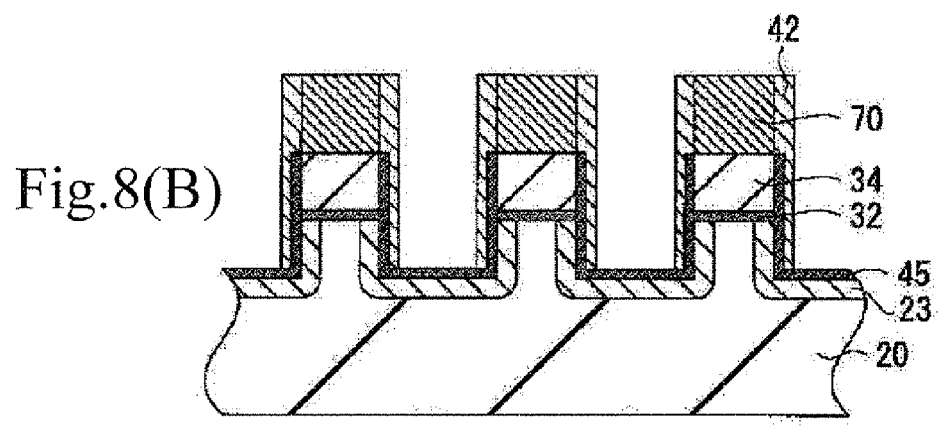
Figure 8C:
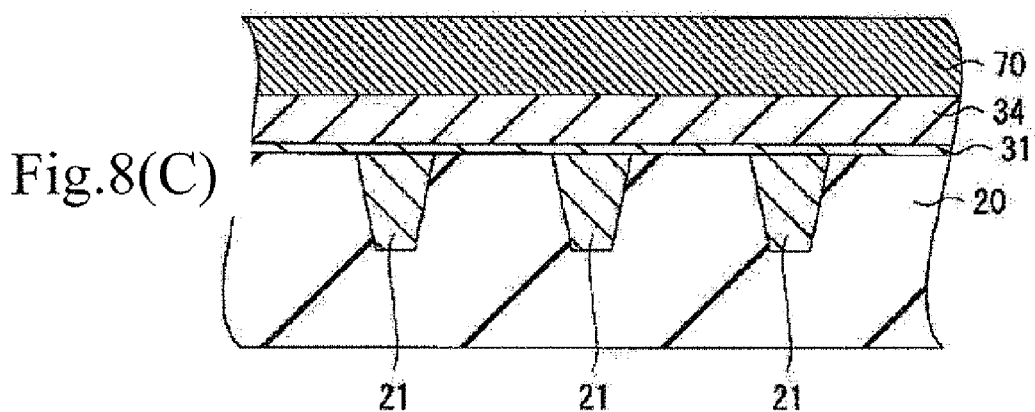
Figure 10A:
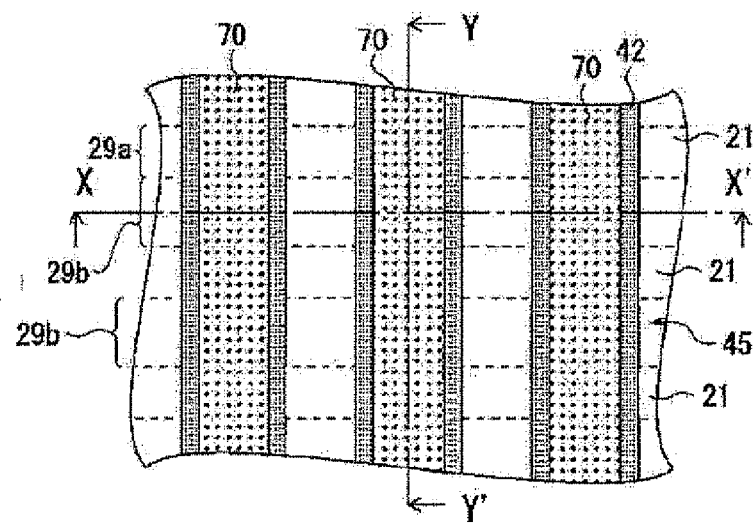
FIG. 10: A view of process diagram (part 7) of a manufacturing method for a non-volatile semiconductor memory.
Figure 10B:
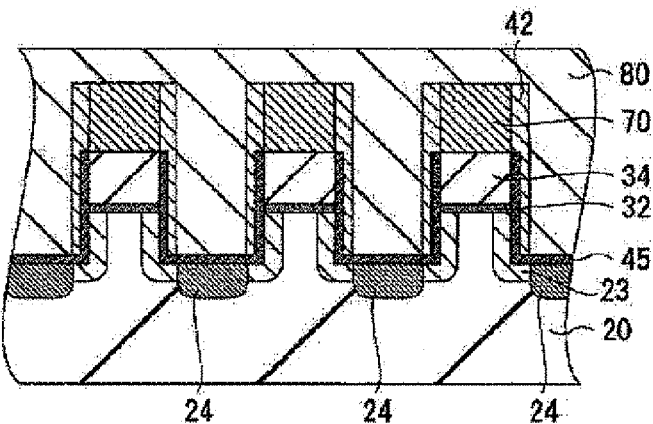
Figure 10C:
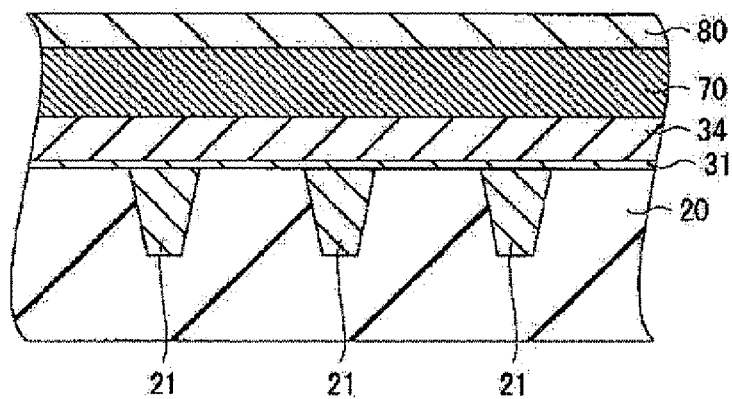
Figure 11A:
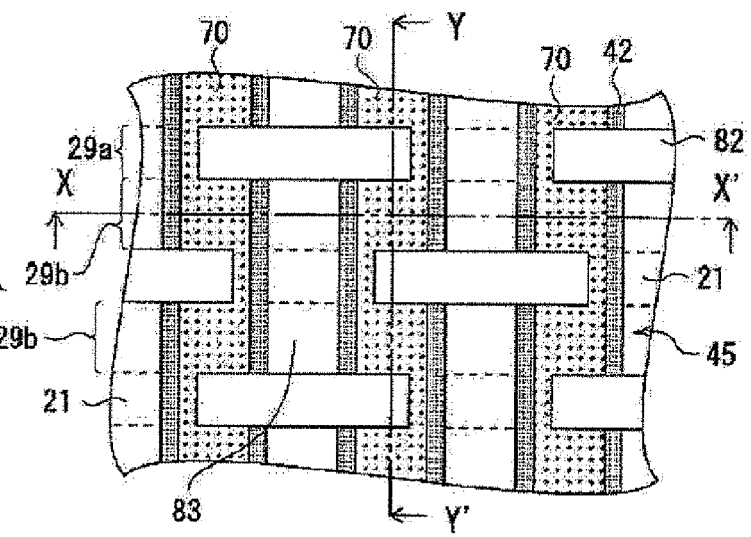
FIG. 11: A view of process diagram (part 8) of a manufacturing method for a non-volatile semiconductor memory.
Figure 11B:
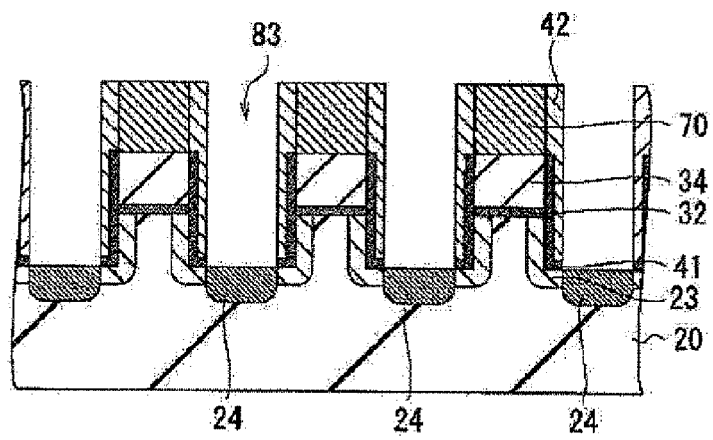
Figure 11C:
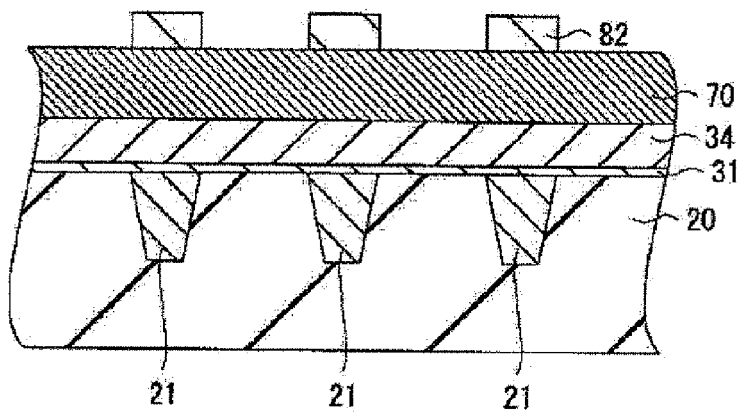

The preferred embodiments of the present invention will be described below, referring to the drawings, and the shapes, sizes and placements of each element are generally shown only to the extend of being able to understand the preferred embodiments of the present invention. Moreover, in the following explanation of the preferred embodiments of the present invention, the compositions (materials) and numerical conditions of each element are only the preferred examples. Consequently, the present invention cannot be limited to the following embodiments. At the same time, in the following drawings, a part of the ground plan is given hatching only for the sake of emphasizing the above hatched part required and the above hatchings does not show any cross section.

Semiconductor Memory Device:

A semiconductor memory device according to the present invention will be explained by taking a non-volatile semiconductor memory apparatus as an example, referring to FIG. 1.

FIG. 1(A) is a view of magnified diagram of a part of the layout of the semiconductor memory apparatus of the present invention. The above semiconductor memory apparatus provided with a plural of memory cells 10 placed in a matrix shape. FIG. 1(B) is a view of a diagram showing generally a structure of one memory cell of a non-volatile semiconductor memory of the present invention, and showing the magnified cross section cut out along the line A-A' of FIG. 1(A).

In the configuration example of FIG. 1(B), a first conductive-type silicon substrate 20 is used as a semiconductor substrate. A plural of element isolation films 21 are formed in parallel and the constant interval, throughout the first direction, that is the gate-length direction, on one side of the main surface 20a of the silicon substrate 20. The element isolation films are formed by STI (Shallow Trench Isolation) method or LOCOS (Local Oxidation of Silicon) method. The region where the above element isolation films 21 are formed is referred to as an element isolation region 29a, and the region between each part of the element isolation region 29a is referred to as an active region 29b.

Each memory cell 10 includes a MOS-type field effect transistor (MOSFET) formed in the silicon substrate 20. The MOSFET includes a gate electrode 34, an impurity diffusion region 24, and a main electrode 36.

The gate electrodes 34 are placed so as to exist in the second direction orthogonal to the first direction, that is, the direction along the gate width. The main electrode 36 consisting of a couple of a first main electrode 36a and a second main electrode 36b is placed so as to clip the gate electrode 34. Each memory cell 10 includes the gate electrode 34, the couple of main electrodes 36a and 36b placed so as to clip the gate electrode 34, a charge storing unit 40 (40a, 40b) formed between the gate electrode 34, and the main electrode 36 (36a, 36b). Since a couple of the charge storing units 40a and 40b is included per one of the memory cells 10, two-bit information can be written thereto. At the same time, the gate electrode 34 is formed in the element isolation region 29a, too, and the gate electrodes 34 between the memory cells 10 neighboring each other in the second direction are connected to each other. In other words, the above gate electrodes 34 also have a function of word line (WL).

Meanwhile, the impurity diffusion region 24 includes the first and second impurity diffusion regions 24a, 24b, therefore, the above impurity diffusion regions are collectively referred to as the impurity diffusion region 24 in the following description. Similarly, the first and second variable-resistance units 22a, 22b are collectively referred to as the variable-resistance unit 22, the first and second main electrodes 36a, 36b are collectively referred to as the main electrode 36, the first and second charge storing units 40a, 40b are collectively referred to as the charge storing units 40, in some cases.

According to a configuration example of the embodiment of the present invention, one main surface, one side out of two, (the first main surface) 20a of the silicon substrate 20 includes two of main surfaces 20aa, 20ab (hereinafter referred to as "upper surface") having different heights from the other main surface (the second main surface) 20b. The region having the lower upper surface 20aa is referred to as the flat region 25, and the region having the upper surface 20ab higher than the upper surface 20aa of the flat region 25 is hereinafter referred to as the step region 27. It is preferable that the side face of the above step region 27 is formed vertically to the upper surfaces 20aa, 20ab. The above flat region 25 and the step region 27 are alternately aligned in line in one direction. In the step region 27 on the first main surface 20a of the silicon substrate 20, the step unit 28 having a shape of an upward-protruding table is formed. The above step unit 28 is formed, for example, by trench etching from the first main surface 20a of the silicon substrate 20 in order and digging down the corresponding part of the silicon substrate to the flat region 25 so as to lower the height of the main surface. In the above structure, the upper region including the step unit 28 from the bottom level of the impurity diffusion region 24 formed in the flat region 25 of the silicon substrate 20 is herein after referred to as surface layer region.

The gate electrode 34 is formed with poly silicon and placed on the main surface 20a, one side out of two, of the silicon substrate 20, that is, in the above case, the gate electrode 34 is placed on the step unit 28 through the intermediary of the gate oxide film 32.

A couple of the first and second impurity diffusion regions 24a, 24b are placed in the surface layer region on the main surface 20a <one side out of two, of the silicon substrate 20, one side of two main surfaces. The above regions 24a, 24b are regions formed from the upper surface 20a into the silicon substrate 20. Moreover, in the case where the above regions 24a, 24b are viewed in planar view from above, the above regions 24a, 24b are formed in the flat region 25 and the active region 29b of the silicon substrate 20 being placed on both sides facing each other and clipping the gate electrode 34 in the gate-length direction. The impurity diffusion region 24 is a second-conductive type region different from the conductive type of the silicon substrate 20, and a region diffused by n-type impurity in high density (n+ region). The impurity diffusion region 24 has a function of a main electrode region, that is, drain or source when the MOSFET is active.

In the surface layer region of the silicon substrate 20, the variable-resistance unit 22 (22a, 22b) is further formed. The first variable-resistance unit 22a is formed between a region underneath the gate electrode 34 and the second impurity diffusion region 24b throughout the MOSFET gate length direction. At the same time, the second variable-resistance unit 22b is formed between a region underneath the gate electrode 34 and the second impurity diffusion region 24b throughout the MOSFET gate length direction.

In the above case, it is preferable that the first and second variable-resistances unit 22a, 22b are formed in the same size and shape as each other. Moreover, both of the first and second variable-resistance units 22a, 22b are separately formed in parallel to each other in the cannel length direction.

In the case where the main surface 20a, one side out of two, of the silicon substrate 20 is viewed in planar view from above, the above variable-resistance unit 22 is formed in the place clipped by the gate electrode 34 and the impurity diffusion region 24. That is, the variable-resistance unit 22 is formed in a shape of "L" character-layer located from the edge of the channel side region through the surface layer region of the flat region 25 and the side face of the step unit 28 to the upper surface 20ab of the step unit 28. At the same time, impurity of the same conductive-type as the impurity diffusion region 24 is injected into the variable-resistance unit 22. Moreover, the variable-resistance unit 22 is a region having a lower impurity density than the impurity region 24 (n– region) and a region for generating hot electron in the case of writing information.

A first main electrode 36a and a second main electrode 36b are formed the first and second impurity diffusion regions 24a, 24b, respectively.

In the case where the first main surface 20a side of the silicon substrate 20 is viewed in planar view from above, a first charge storing unit 40a is placed in the place clipped by the first electrode 36a and the gate electrode 34, and neighboring, that is, facing directly the first electrode 36a and the gate electrode 34, respectively, throughout the channel length direction. The first charge storing unit 40a has a multi-layer structure (referred to as 'ONO multi-layer insulating film') having a bottom silicon oxide film 41a, a charge storing nitride film 42a, and a top silicon oxide film 43a sequentially stacked mainly in the channel-length direction.

The bottom silicon oxide film 41a is formed in a shape of "L" character layer having a constant thickness of around from 5 to 10 um, located throughout from the flat region 25 of the silicon substrate 20, to the step unit 28, to the gate oxide film 32 and the sidewall of the gate electrode 34. The charge storing nitride film 42a is formed on the charge storing nitride film 41a formed on the sidewall of the gate electrode 34, having a constant thickness of around from 5 to 10 um. The charge storing nitride film 42a part clipped by the step unit 28 and the first main electrode 36a is formed in a shape of parallel flat plane. The top silicon oxide film 43a is formed on the charge storing nitride film 42a, facing the sidewall of the main electrode 36a and having a constant thickness of around from 2 to 10 um.

By the above configuration, the charge storing nitride film 42a becomes parallel to the first main electrode 36a, that is, the distance between the charge storing nitride film 42a and the first main electrode 36a becomes constant. In the above case, it is referable that the side face 28a of the step unit 28 is formed vertically to the first main surface 20a.

In the case where a main surface 20a side of the silicon substrate 20 is viewed in planar view from above, a second charge storing unit 40b is placed in the place clipped by the second electrode 36b and the gate electrode 34 and clipped by the second electrode 36b and the step unit 28, and neighboring the second electrode 36b and the gate electrode 34, throughout the channel length direction. The second charge storing unit 40b is formed by the ONO multi-layer similarly to the first charge storing unit 40a, and through the intermediary of the step unit 28 and the gate electrode 34, symmetrically to the first charge storing unit 40a.

Carrier injected into the charge-storing unit 40 is stored in mainly the charge storing nitride film 42 among the above ONO multi-layer insulating film. Meanwhile, the configuration and material of the charge storing unit 40 can be selected arbitrarily and preferably corresponding to the application of the memory, and the charge storing unit 40 can have a structure having one or more than two insulating films out of silicon nitride film, aluminum oxide film, and fafnium oxide film, clipped between the bottom silicon oxide film 41 and the top silicon oxide film 43. At the same time, the variable-resistance unit and the charge storing unit can be configured between one out of the first impurity diffusion region and the second impurity diffusion region, and the gate electrode. However, two-bit information can be written in one memory cell by placing the variable-resistance unit and the charge storing unit between the first impurity diffusion region and the gate electrode, and between the second impurity diffusion and the gate electrode.

In addition, it is recommended that the step be located beyond the extended line drew 4between the main electrode 36 and the charge storing nitride film 42 in the shortest distance in order to inject effectively charge into the charge storing unit 40. Consequently, it is preferable that the height of the step 28 is set to around 50 nm, considering etching process time for forming the trench.

The case where a p-type silicon substrate is used as the first conductive-type semiconductor substrate is explained hereinbefore, however, the present invention is not limited to the above example. A configuration of the n-type silicon substrate including p-type well can be used as the first conductive-type semiconductor substrate. Moreover, the first conductive-type can be n-type, and the second conductive-type can be p-type.

The method for judging whether or not charge is present in the non-volatile semiconductor memory according to the present invention will be explained below, referring to FIG. 2 and FIG. 3. FIG. 2 is a view of explanatory model diagram of the judging method whether or not charge is present in the non-volatile semiconductor memory being aforementioned referring to FIG. 1. Moreover, FIG. 3 is a view of model diagram of the sub-threshold characteristics of the non-volatile semiconductor memory being aforementioned referring to FIG. 1. In FIG. 3, the horizontal axis indicates the gate voltage Vg (V) and the vertical axis indicates the drain-source current Ids (A) in logarithmic scale.

In FIG. 3, the curb I indicates the drain-source current Ids in the case where neither of the first and second charge storing units 40a, 40b includes charge. Secondly, the curb II indicates the drain-source current Ids in the case where the second charge storing unit 40b only includes charge. Additionally, the curb III indicates the drain-source current Ids in the case where the first charge storing unit 40a only includes charge.

FIG. 2(A) shows the state where no electron is stored only in the first and the second charge storing units 40a, 40b. In the case thereof, the second variable-resistance 22b does not rise. In FIG. 3, the curb I indicates the drain-source current Ids in the above case.

Meanwhile, FIG. 2(B) shows the case where electron is stored in the second charge storing unit 40b. In the case thereof, plus charge is induced in the second variable-resistance unit 22b of the silicon substrate 20 located in the closest position from the electron-stored place, in the case where electron is stored only in the second charge storing unit 40b. In the above configuration, since the charge storing nitride film 42 is formed in flat-plane shape parallel to the sidewall of the step unit 28 and there is no parallel part to the upper surface of the flat region 25 on the above upper surface, plus charge is induced mainly on the sidewall of the step unit 28.

By the above induced plus charge, the resistance value of the variable-resistance unit 22b facing the second charge storing unit 40b rises. In the case where the second charge storing unit 40b is read out, the second impurity diffusion region (source) 24b neighboring the second charge storing unit 40b is set to the ground voltage, and the first impurity diffusion region (drain) 24a placed in the opposite side through the intermediary of the gate electrode 34. In the above case, the charge stored in the second charge storing unit 40b induces plus charge in the second charge storing unit 40b facing thereto. The induced plus charge raises the resistance value of the variable-resistance unit 22b facing the second charge storing unit 40b, and the drain-source current Ids falls lower than in the case where no electron is stored in the first and second charge storing units 40a, 40b (indicated by II in FIG. 3).

The above presence and absence of charge in the second charge storing unit 40b causes the drain-source current differential and then whether the data is "0" or "1" is judged by the above drain-source current differential.

FIG. 2(C) shows the case where electron is stored only in the first charge storing unit 40a located on the opposite side through the intermediary of the second charge storing unit 40b being read out and the gate electrode 34.

In the case where electron is stored in the first charge storing unit 40a, similarly, plus charge is induced in the first variable-resistance unit 22a facing thereto. However, since the electric field between the plus voltage applied to the first main electrode 36a and the step unit 28 heads to the opposite direction to the electric field formed by the electron stored in the first charge storing unit 40a, and then cancels the above electric field formed by the electron. Consequently, when plus voltage is applied to the first main electrode 36a, the plus charge induced by the electron stored in the charge storing unit can be reduced, and therefore variation of the resistance value of the first variable-resistance unit 22a can be reduced. In other words, the drain-source current Ids differential between the case where electron is stored in the second storing unit 40a (indicated by "II" in FIG. 3) and the case where no electron is stored in the second charge storing unit 40b and electron is stored in the first charge storing unit 40a (indicated by "III" in FIG. 3) cannot easily become smaller than.

According to the aforementioned semiconductor memory apparatus, the charge-storing unit is included in the place clipped by the step unit and the main electrode of the silicon substrate so that the above charge-storing unit neighbors the above main electrode and the step unit, respectively. Moreover, the distance between main electrode and the charge-storing nitride film formed in the charge-storing unit neighboring the above main electrode is constant.

In the above case, since the electric field between the plus voltage applied to the main electrode and the step unit heads to the opposite direction to the electric field generated by the electron stored in the charge-storing unit, it is contemplated that the above electric field cancels the electric field generated by the electron. Consequently, when plus voltage is provided the main electrode, plus charge induced by the electron stored in the charge storing unit neighboring the main electrode provided with plus voltage can be reduced.

Therefore, the electric field to the variable-resistance unit induced by the electron stored in the charge storing nitride film can be restrained and resistance rising of the variable-resistance unit can be prevented.

Manufacturing Method for the Semiconductor Memory Device: 4

A manufacturing method for a semiconductor memory device according to the present invention will be explained below, referring to FIGS. 4-FIG. 14. FIGS. 4-FIG. 14 are views of process diagrams explaining a manufacturing method for a semiconductor memory apparatus according to the present. FIG. 4(A) is a general top view of a silicon substrate having an element isolation film formed therein. FIG. 4(B) is a view of cross section cut out along the line X-X' of FIG. 4(A). FIG. 4(C) is a view of cross section cut out along the line Y-Y' of FIG. 4(A).

Similarly, FIG. 5(A), FIG. 6(A), FIG. 7(A), FIG. 8(A), FIG. 9(A), FIG. 10(A), FIG. 11(A), FIG. 12(A), FIG. 13(A), and FIG. 14(A) are views of general top views of structures formed in each of the processes.

FIG. 5(B), FIG. 6(B), FIG. 7(B), FIG. 8(B), FIG. 9(B), FIG. 10(B), FIG. 11(B), FIG. 12(B), FIG. 13(B), and FIG. 14(B) are views of cross sections cut out along the lines X-X' of FIG. 5(A), FIG. 6(A), FIG. 7(A), FIG. 8(A), FIG. 9(A), FIG. 10(A), FIG. 11(A), FIG. 12(A), FIG. 13(A), and FIG. 14(A), respectively.

FIG. 5(C), FIG. 6(C), FIG. 7(C), FIG. 8(C), FIG. 9(C), FIG. 10(C), FIG. 11(C), FIG. 12(C), FIG. 13(C), and FIG. 14(C) are views of cross sections cut out along the lines Y-Y' of FIG. 5(A), FIG. 6(A), FIG. 7(A), FIG. 8(A), FIG. 9(A), FIG. 10(A), FIG. 11(A), FIG. 12(A), FIG. 13(A), and FIG. 14(A), respectively.

The manufacturing method for a semiconductor memory device according to the present invention includes the following sequential processes.

First, a p-type silicon substrate 20 needs to be prepared as a first conductive-type semiconductor substrate. The element isolation film 21 is formed by, for example, STI (Shallow Trench Isolation) method on the main surface 20a, one side out of two, of the silicon substrate 20. In addition, the element isolation film 21 can be formed by LOCOS (Local Oxidation of Silicon) method. The plural of element isolation films 21 are placed throughout the first direction, and are arranged in parallel, in a constant width, in a constant interval, and along the second direction orthogonal to the first direction. Moreover, a silicon substrate including p-type well formed on n-type substrate can be used as a p-type silicon substrate (FIGS. 4(A), (B), and (C)).

Secondly, the gate oxide film, the conductive film, and the first silicon nitride film are sequentially stacked on the main surfaces 20a, one side out of two, of the silicon substrate 20. For the above purpose, the gate oxide film 31 is formed by, for example, thermal oxidation, first. Secondly, the conductive film of poly-silicon film stacked with poly-silicon by, for example, CVD (Chemical Vapor Deposition) method is formed. Furthermore, the first silicon nitride film is formed by, for example, CVD method.

Subsequently, the step region 27 having a straight belt shape is formed in parallel at a constant interval. In the above process, the region between each of the step regions 27 is formed as the flat region 25.

Secondly, the first silicon nitride film of the step region 27 is left by patterning the first silicon nitride film 27. At the same time, a nitride film mask 70 is formed by removing the silicon nitride film of the flat region 25. Formation of the nitride film mask 70 is done by conventionally known photolithography and dry etching.

Furthermore, poly-silicon film is processed by dry etching using the nitride film mask 70 to form the gate electrode 34. The plural of gate electrodes 34 are placed throughout the second direction, and are arranged in parallel, in a constant width, in a constant interval, and in the first direction. In other words, the gate electrode 34 is formed orthogonal to the element isolation film 21. (FIGS. 5(A), (B), and (C)).

Subsequently, dry etching is done using the nitride film mask 70 and the gate electrode 34 as masks to remove the gate oxide film of the flat region 25 and expose the silicon substrate 20. During the process thereof, the gate oxide film 32 of the step region 27 is left thereon.

Moreover, trench etching is done using the nitride film mask 70 and the gate electrode 34 as a mask to form a trench ('mizo' in Japanese) 72 on one of the main surfaces of the silicon substrate 20. The bottom plane of the trench 72 is a flat plane parallel to the main surface 21 and is the upper surface of the flat region 25. The trench 72 thereof is formed between each of the gate electrodes 34 neighboring each other in a constant width and in parallel.

In addition, the etching for forming the trench 72 can be done using anisotropic etching from an arbitrarily and properly vertical direction. The side face of the step unit 28 becomes vertical to the main surface of the silicon substrate. by the above anisotropic etching.

By trench etching, the trench 72 is formed in the flat region of the silicon substrate 20 and the step unit 28 is formed in the step region. Regarding the depth of the trench 72, that is, the height of the step unit 28 from the upper surface of the silicon substrate 20 in the flat region 25, the charge storing nitride film processed in the following process needs to be located lower than the upper surface of the step unit 28. The lower edge of the charge storing nitride film is located in the upper face of the bottom oxide film formed on the flat region. Since the bottom oxide film is formed in the thickness of around 5-10 nm, the depth of the trench needs to be larger than 10 nm, at least, and the formation thereof in the depth of around 50 nm is preferable in consideration of etching time.

Secondly, a first silicon oxide film 45 is formed in the upper surface of the silicon substrate 20 in the flat region 25, and in the side face of the gate electrode 34 the step unit 28, and the gate oxide film 32. The first silicon oxide film 45 is formed by, for example, thermal oxidation. (FIGS. 6(A), (B), and (C)).

Subsequently, in the case where one of the main surface sides of the silicon substrate 20 is vied in planar from above, the low-density impurity diffusion region 23 is formed in the places clipping the gate electrode 34 from the both side thereof, respectively. The low-density impurity region 23 is formed in a constant thickness from each of the surfaces 21 and 28a, throughout from the flat region 25 of the silicon substrate 20 to the side face 28a of the step unit 28. An n-type impurity is implanted as the second conductive type from a inclined direction from the vertical direction of the flat region 25 in order to form the low-density impurity diffusion region in the side face 28a of the step unit 28. (Indicated by the arrowhead in FIG. 7(B)). In the above case, Arsenic (As) is implanted as the impurity in density of around $1\times10^{13}$ pieces/cm$^2$. The aforementioned low-density impurity diffusion region 23 is formed from the top to the lower face of the step unit 28 along the side face 28a exposed from the trench 72 along the exposed side face 28a on the trench 72, further formed to the side face 28a of the step 28 neighboring along the bottom face of the trench 72 (FIGS. 7(A), (B), and (C)).

Subsequently, the silicon nitride film is formed on the firs silicon oxide film 45 by CVD method. After the above process, the part of the second silicon nitride film on the flat region 25 parallel to the first main surface is removed by the conventionally known dry etching. Consequently, the second silicon nitride film is processed to form a parallel and flat plane to the side face of the step unit 28, and left therein as the charge storing nitride film 42 (FIGS. 8(A), (B), and (C)).

Subsequently, the impurity diffusion region 24 is formed on the silicon substrate 20 in the flat region 25. In the process thereof, the nitride film mask 70 and the charge storing nitride film 42 are used for masks, and n-type impurity is implanted in the vertical direction to the flat region 25 as the second conductive type (indicated by the arrowhead "II" in FIG. 9(B)). For example, As is implanted in density of around $1\times10^{15}$ pieces/cm2 as the impurity. By the above As-implantation, the impurity diffusion region 24 is formed in the flat region 25 of the low-density impurity diffusion layer 23. The region having none of the formed impurity diffusion region 24 of the low-density impurity diffusion layer 23 becomes the variable-resistance unit 22 (FIGS. 9(A), (B), and (C)).

After the above processes, the second silicon oxide film 80 is formed by CVD method, and is planarized by, for example, CMP method. The second silicon oxide film is formed on the impurity diffusion region 24, the nitride film mask 70, and the charge storing nitride film 42 and is mounted between each of the neighboring gate electrodes 34 (FIGS. 10(A), (B), and (C)).

Secondly, an oxide film mask 82 is formed in the element isolation region 29a by patterning the second silicon oxide film 80. In the process thereof, the part on the element isolation film 21 of the second silicon oxide film 80 is left and other parts are removed to form an opening unit 83, by photolithography and dry etching. The above etching is continued till the impurity diffusion region 24 is exposed (FIGS. 1(A), (B), and (C)).

In addition, the oxide film mask 82 is formed in a strip shape in the first direction from one step-region through the other step region neighboring each other in the first direction. The oxide film mask 82 covers one of the flat regions neighboring through the intermediary of the step region and exposes the other flat region. At the same time, the above oxide film mask covers one element isolation region neighboring through the intermediary of the active region and exposes the other element isolation region.

Figure 12A:
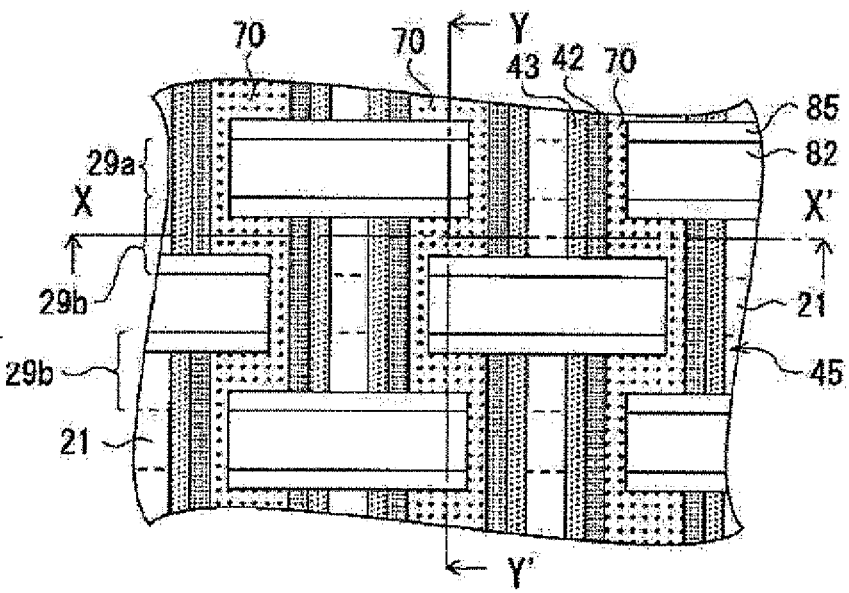
FIG. 12: A view of process diagram (part 9) of a manufacturing method for a non-volatile semiconductor memory.
Figure 12B:
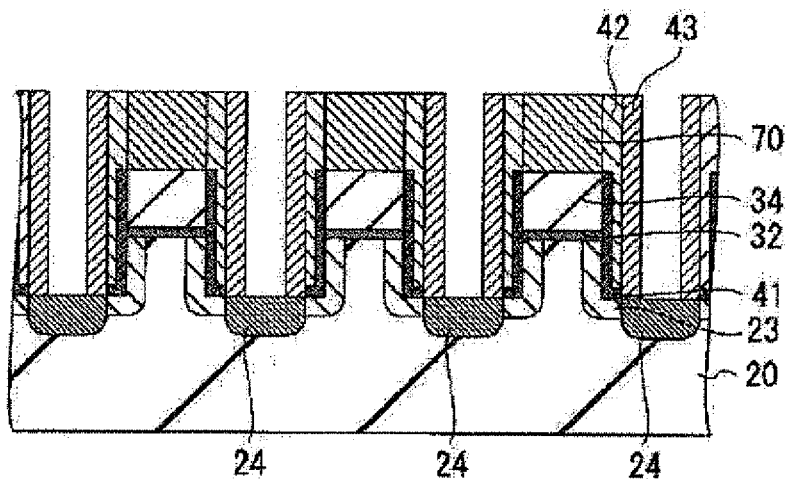
Figure 12C:
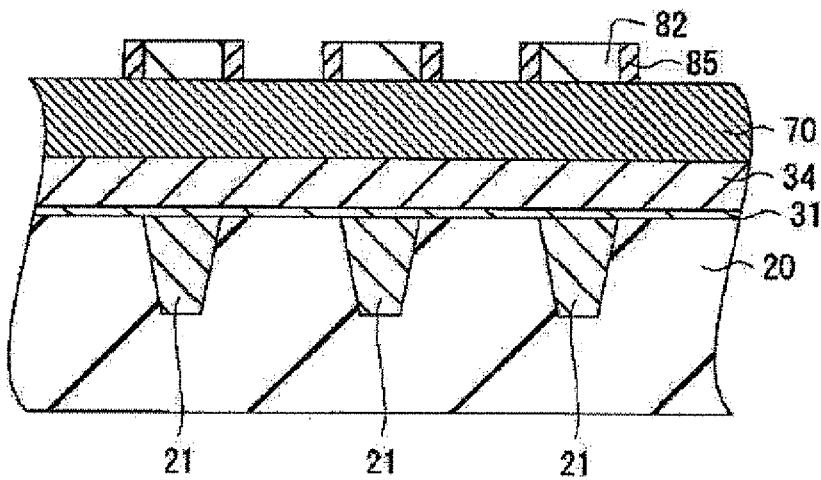

Secondly, the top oxide film 43 is formed on the charge storing nitride film 42 by CVD method, and processed by anisotropic etching from the vertical direction (FIGS. 12(A), (B), and (C)). In the process thereof, the silicon oxide film 85 is formed on the sidewall of the oxide film mask 82, too.

Figure 13A:
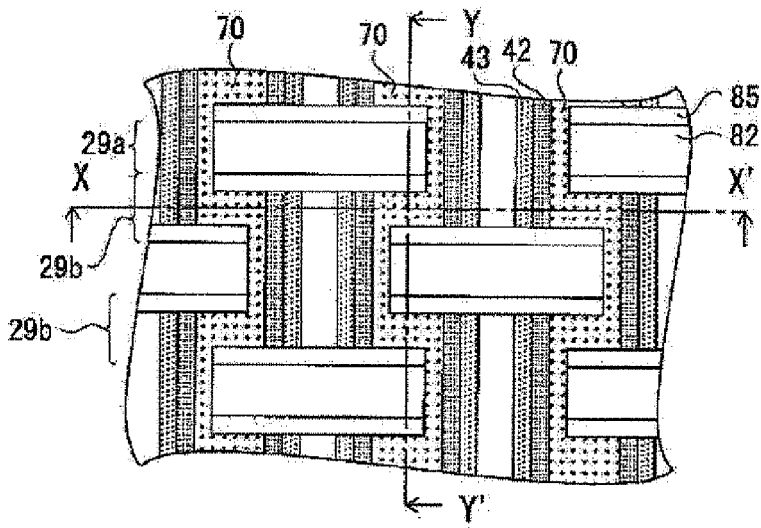
FIG. 13: A view of process diagram (part 10) of a manufacturing method for a non-volatile semiconductor memory.
Figure 13B:
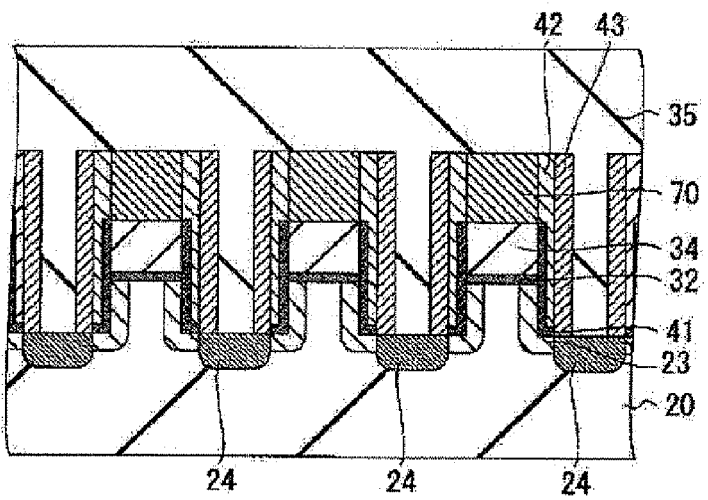
Figure 13C:
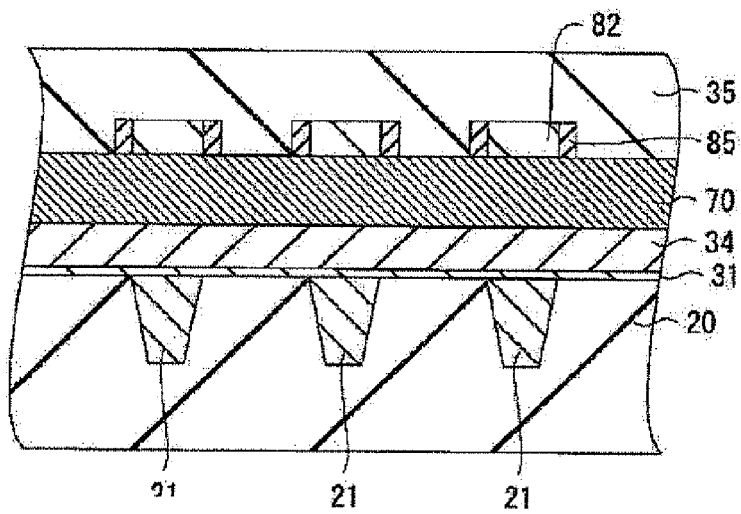
Figure 14A:
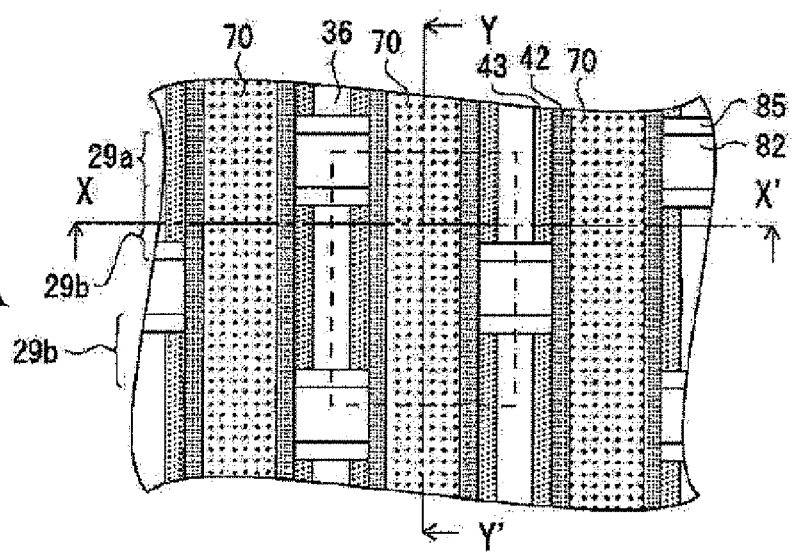
FIG. 14: A view of process diagram (part 11) of a manufacturing method for a non-volatile semiconductor memory.
Figure 14B:
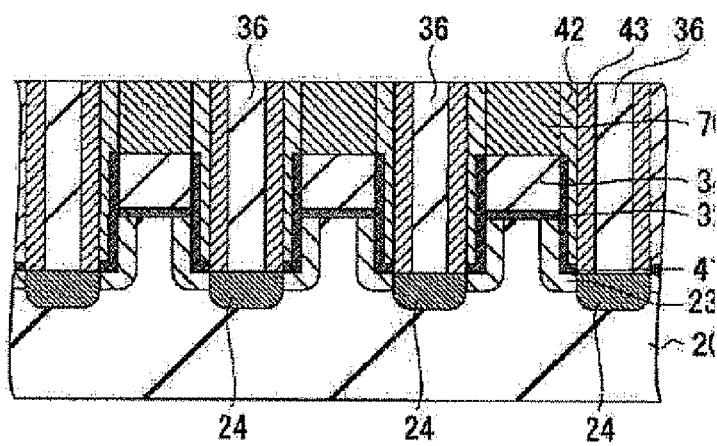
Figure 14C:
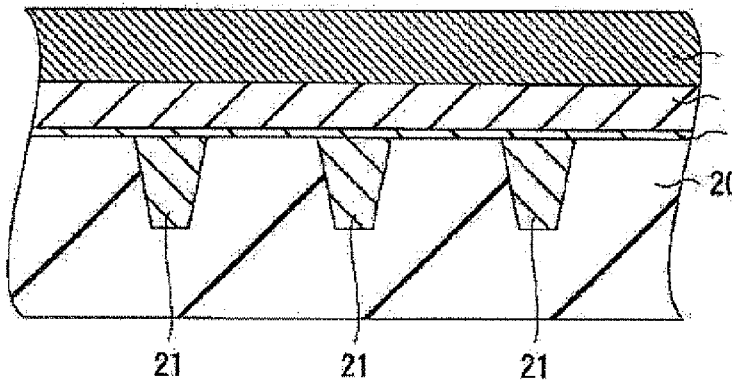

Subsequently, Tungsten (W) is stacked so as to fill in the region clipped by the charge storing unit 40 on the flat region 25 and form the conductive film 35 (FIGS. 13(A), (B), and (C)).

Subsequently, the nitride film mask 70 is exposed by grinding down the tungsten conductive film 35 and the oxide film mask 82 by CMP method.

As explained before, the charge storing unit 40 and the main electrode 36 are formed in parallel to the gate electrode 34 throughout the channel direction of the silicon substrate 20.

Since the metal interconnections and the inter-layer films can be formed by conventionally known methods, the explanation thereof is omitted.

According to the production method for a semiconductor memory apparatus of the present invention, the opening for mounting the conductive film is formed by etching using an oxide film mask. In the case where the rectangular opening is formed by ordinal photolithography and dry etching, since photolithography light cannot be easily focused around the corners of the rectangle, there is some possibility that the edges are rounded. On the other hand, according to the present invention, the oxide film is formed in a stirp shape and the opening is formed by photolithography using the faces of the charge storing nitride film and the oxide film mask, and then the edges of the opening are not rounded. Consequently, the distance between the main electrode and the charge storing nitride film can be kept constant.

In addition, according to the above mentioned configuration, since the main electrodes located between neighboring memory cells through the intermediary of the element isolation region in the second direction are configured to connect to each other, interconnections connecting two neighboring main electrodes becomes unnecessary.

Figure 15A:
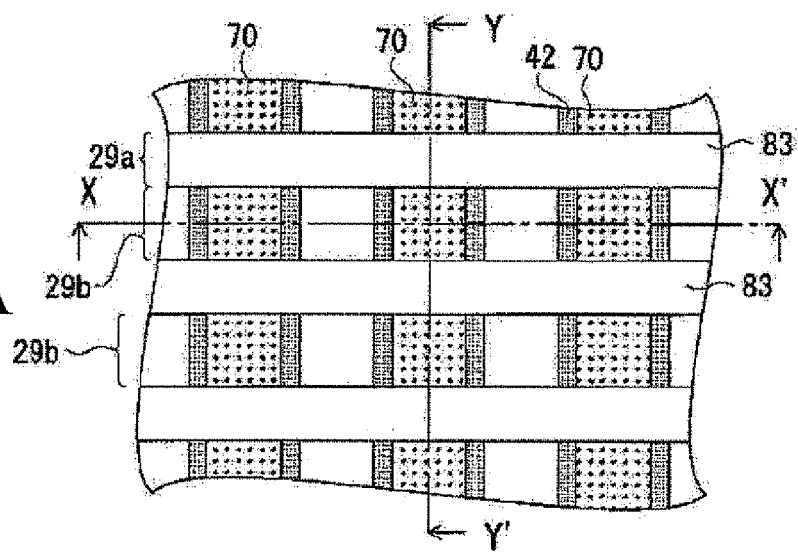
FIG. 15: A view of process diagram of another manufacturing method for a non-volatile semiconductor memory.
Figure 15B:
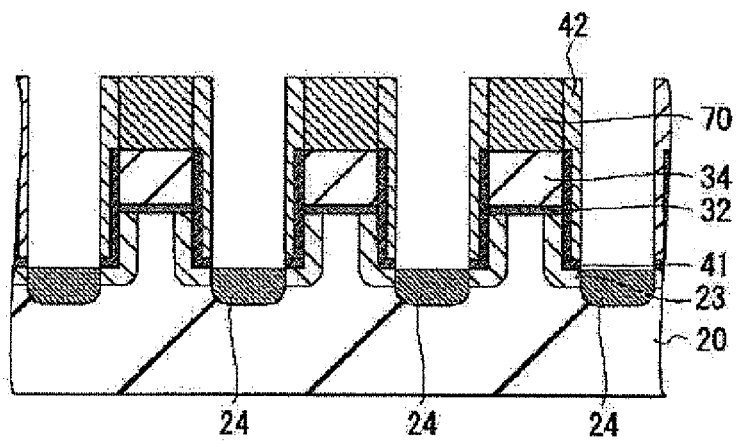
Figure 15C:
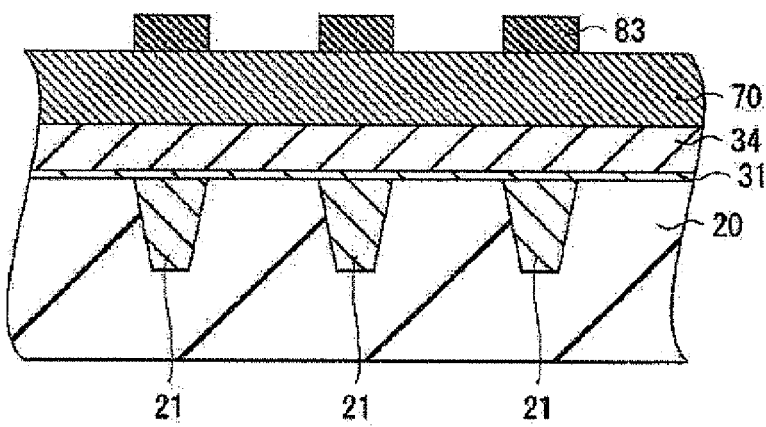

Another Manufacturing Method for the Semiconductor Memory Device:

Another production method for a semiconductor memory device according to the present invention will be explained, referring to FIG. 15. FIG. 15 is a view of explanatory diagram of another manufacturing method for a semiconductor memory apparatus according to the present invention. FIG. 15(A) is a view of general top view. FIG. 15(B) is a view of cross section cut out along the line X-X' of FIG. 15(A). FIG. 15(C) is a view of cross section cut out along the line Y-Y' of FIG. 15(A).

The method explained herein has a different shaped oxide film mask, however, other processes are the same as ones in the aforementioned manufacturing method referring to FIG. 4-14. The overlapped explain is omitted hereinafter.

In the process thereof, the oxide film mask is formed in a strip shape located throughout on the element isolation region.

According to another manufacturing method for a semiconductor memory device of the present invention, the opening for filling in the conductive film is formed by etching using the oxide film mask. In the case where a rectangular opening is formed by ordinary photolithography and dry etching, it is possible that the edge thereof is rounded, because the photolithography light cannot be easily focused around the corner of the rectangular. On the other hand, according to the above-mentioned manufacturing method, since the oxide film is formed in a contiguous belt shape, the opening is formed by photolithography using the faces of the charge storing nitride film and the oxide film mask, and therefore the edges of the opening are not rounded. Consequently, the distance between the main electrode and the charge storing nitride film can be kept constant.

At the same time, according to the above mentioned configuration, since the oxide film mask is formed in a belt shape, fine patterning becomes easier than in the case where the oxide film mask is formed in a strip shape.

What is claimed is:

1. A semiconductor memory device comprising;
    a first conductive-type semiconductor substrate including a flat region and a step region having one main surface higher than the other main surface placed higher than said flat region;
    a gate electrode being formed on one of main surfaces of said semiconductor substrate in said step region through the intermediary of a gate oxide film;
    A couple of first and second impurity diffusion regions of a second conductive-type different from said first conductive-type being formed in the place clipping said gate electrode of a part of said flat region in the surface layer region on one of main surface sides of said semiconductor substrate;
    second conductive-type first and second variable resistance regions having lower impurity density than said first and second impurity regions and being formed respectively from the region neighboring said first and second impurity regions of said flat region to a side face of a step unit placed in said step region between the region underneath said gate electrode and said first and second impurity regions in said surface layer region
    a first and second main electrodes being formed on said first and second impurity region of said semiconductor substrate;
    a first charge storing unit being formed between and facing said first electrode and said gate said electrode; and
    a second charge storing unit being formed between and facing said second electrode and gate electrode,
    wherein said first and second charge storing units have a multi-layer structure in order from a bottom oxide film, to charge storing nitride film, to top oxide film, respectively,
    the distance between said first main electrode and said charge storing nitride film formed in said first charge storing unit is constant, and the distance between said second main electrode and said charge storing nitride film formed in said second charge storing unit is constant.

2. A method for manufacturing a semiconductor memory device comprising;
    a process for forming a plural of element isolation films in parallel, in a constant interval, and throughout a first direction on one of main surfaces of first conductive-type semiconductor substrate;
    a process for forming sequentially a gate oxide film, a conductive film, and a first silicon nitride film on said one of main surfaces of first conductive-type semiconductor substrate;
    a process for forming step regions in parallel, in a constant interval, and throughout a second direction vertical to said first direction and forming a flat reign between each of said step regions;
    a process for forming a nitride film mask by patterning said first silicon nitride film, leaving said first silicon nitride film of said step region, and removing said silicon nitride film of said flat region;
    a process for forming a gate electrode by patterning said conductive film by etching using said nitride film mask;
    a process for forming a table-shaped step unit on one of main surfaces of said semiconductor substrate by removing said gate electrode of said flat region by etching using said nitride film mask and said gate electrode as masks, and by trench etching said semiconductor substrate in said flat region;
    a process for forming a first silicon oxide film on one of main surfaces of said semiconductor substrate in said flat region and on side faces of said step unit, said gate oxide film, and said gate electrode;
    a process for forming a low-density impurity diffusion region by implanting impurity of a second conductive type different from said first conductive-type unit from the flat region of the trench bottom to the side face of said step unit in the region clipping said gate electrode of said semiconductor substrate;
    a process for forming a charge storing nitride film by etching a silicon nitride film after said silicon nitride film is formed on said first silicon oxide film on the side face of said step unit, said gate oxide film, and said gate electrode, and by processing said silicon nitride film into a flat-plane shape parallel to the side face of said step unit;
    a process for forming a impurity diffusion region by implanting impurity of said second conductive type into a part of said flat region of said semiconductor substrate in said low-density impurity diffusion region, using said nitride film mask and said charge storing nitride film as a mask, and for turning a part of said low-density impurity region between the region underneath said gate electrode and said impurity diffusion region in the surface layer region of said semiconductor substrate into a variable-resistance region;

a process for filling in the place between gate electrodes neighboring each other by forming a second silicon oxide film on said impurity diffusion region, said nitride film mask, and said charge storing nitride film;

a process for forming an oxide film mask throughout said first direction on an element isolation region by patterning said second silicon oxide film, and exposing the semiconductor substrate in the region clipped by said charge storing nitride film between oxide film masks neighboring each other in said second direction;

a process for forming a top oxide film on said charge storing nitride film on the side face of said step unit, said gate oxide film, said gate electrode;

a process for forming a main electrode on said exposed semiconductor substrate.

3. The method according to claim 2, wherein said oxide film mask is formed in a shape of strip placed from one step region to another step region neighboring in said first direction throughout said first direction, said oxide film mask covers one of neighboring flat regions and exposes the other flat region, and said oxide film mask covers one of neighboring element isolation regions and exposes the other element isolation region.

4. The method according to claim 2, wherein said oxide film mask is formed in a shape of a contiguous belt on said element isolation region.

* * * * *